United States Patent
Nishiyama et al.

(10) Patent No.: US 6,924,536 B2
(45) Date of Patent: Aug. 2, 2005

(54) SEMICONDUCTOR DEVICE AND ITS MANUFACTURING METHOD

(75) Inventors: Akira Nishiyama, Kanagawa-ken (JP); Seiji Inumiya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 10/372,963

(22) Filed: Feb. 26, 2003

(65) Prior Publication Data

US 2003/0218223 A1 Nov. 27, 2003

(30) Foreign Application Priority Data

Feb. 26, 2002 (JP) ........................................ 2002-049464

(51) Int. Cl.[7] ............................................ H01L 31/119
(52) U.S. Cl. .................... 257/411; 257/410; 257/288; 257/368; 257/408; 438/287; 438/216; 438/261
(58) Field of Search .............................. 257/411, 410, 257/288, 368, 408; 438/287, 216, 261

(56) References Cited

U.S. PATENT DOCUMENTS

| | | | | |
|---|---|---|---|---|
| 5,554,876 A | * | 9/1996 | Kusunoki et al. ........... | 257/411 |
| 5,994,747 A | * | 11/1999 | Wu ............................. | 257/408 |
| 6,057,217 A | * | 5/2000 | Uwasawa .................... | 438/585 |
| 6,110,784 A | * | 8/2000 | Gardner et al. ............. | 438/287 |
| 6,225,669 B1 | * | 5/2001 | Long et al. .................. | 257/401 |
| 6,323,519 B1 | * | 11/2001 | Gardner et al. ............. | 257/336 |

FOREIGN PATENT DOCUMENTS

JP 48-56069 8/1973

* cited by examiner

Primary Examiner—Nathan J. Flynn
Assistant Examiner—Remmon R. Fordé
(74) Attorney, Agent, or Firm—Oblon, Spivak, McClelland, Maier & Neustadt, P.C.

(57) ABSTRACT

A semiconductor device and a method of manufacturing the semiconductor device are disclosed. A semiconductor device of one of several disclosed embodiments comprises a semiconductor layer having a source region and a drain region, and a gate insulating film provided on the semiconductor layer between the source region and the drain region. The gate insulating film comprising an oxide including a metal element and further includes at least one element selected from the group consisting of nitrogen and aluminum as a first element. The content of the first element is relatively higher at both ends near the source region and the drain region than at a center of the gate insulating film. A gate electrode is provided on the gate insulating film.

28 Claims, 25 Drawing Sheets

SEMICONDUCTOR DEVICE AND ITS MANUFACTURING METHOD

CROSS-REFERENCE TO RELATED APPLICATIONS

This application is based upon and claims the benefit of priority from the prior Japanese Patent Application No. 2002-049464, filed on Feb. 26, 2002; the entire contents of which are incorporated herein by reference.

BACKGROUND OF THE INVENTION

This invention relates to a semiconductor device and its manufacture method, and especially to a MIS (Metal-Insulator-Semiconductor) type semiconductor device having a gate insulating film which comprising a material, such as a metal oxide that has a dielectric constant higher than silicon oxide, and to its manufacture method.

Miniaturization of MOS transistors is continuously advanced, and 0.1-micrometer gate length is almost being realized. This is because the "reduction rule/scaling rule" is still effective, where a miniaturization of semiconductor elements leads to a high speed operation and a lower power consumption the semiconductor devices. On the other hand, by making a semiconductor element smaller, occupancy area of the element is reduced and more elements can be integrated in the same chip area. As a result, LSI can be multi-functionalized. Also from this point, it is worthy of pursuing a miniaturization of a semiconductor element.

However, it is expected that pursuit of a reduction rule collides with a big wall bordering on 0.1 micrometers. That is, an approach to make a thinner gate oxidization film is coming to a limit.

Conventionally, $SiO_2$ (silicon oxide) has been used as a material of an insulating film provided in the bottom of a gate electrode. This is because the insulating film hardly contains a fixed electric charge, and because undesirable energy levels at interface between silicon and the insulating film at a channel area are hardly formed. These two special features are indispensable in order to obtain a good operation of a semiconductor element. A silicon oxide also has a feature that a thin film can be easily formed with sufficient controllability of the thickness.

However, the relative dielectric constant of $SiO_2$ is as low as about 3.9. In order to realize a transistor having a gate length (Lg) of 0.1 micrometers or less, it is necessary to set the thickness of the gate insulating film to 3 nm or less. However, in the case of a transistor having such a thin silicon oxide film, it is predicted that an increase in the leak current between the gate and a substrate becomes a problem because carriers may tunnel through the film directly. This trade-off relation is an essential problem as long as $SiO_2$ is used as a gate insulating film, and it is thought that its evasion is impossible.

On the other hand, by using a high dielectric material having a relative dielectric constant larger than $SiO_2$, a gate insulating film is formed thickly and it is possible to avoid such a tunneling phenomenon. As the materials, metal oxide, such as $ZrO_2$, $HfO_2$, or compounds of these oxides and $SiO_2$ (so-called "silicate"), etc. can be used.

Since the relative dielectric constant of such high dielectric material is as high as about ten or more, it becomes possible to increase the thickness twice or more compared with $SiO_2$ while obtaining the same gate capacitance. Thus, these high dielectric materials are considered to be the promising material which can suppress the tunneling of carriers.

However, the Inventors have discovered that a problem which is explained below arose, in a case where a semiconductor device which has the gate insulating film using such high dielectric material was manufactured according to the normal manufacturing process.

FIGS. 25A through 26C are process sectional diagrams showing principal parts of manufacturing process of MISFET (MIS Field Effect Transistor) according to a usual process flow.

First, as shown in FIG. 25A, an isolation layer 101 which consists of an insulating material is formed near the surface of the silicon semiconductor layer 100, and the gate insulating film 102 is further formed on the semiconductor layer 100.

Next, as shown in FIG. 25B, a polycrystalline silicon layer 103 used as a gate electrode is formed on the gate insulating film 102. Next, as shown in FIG. 25C, a pattering of the polycrystalline silicon layer is carried out, and the gate electrode 103 is formed. Next, as shown in FIG. 26A, a patterning of the gate insulation film 102 is carried out.

Then, as shown in FIG. 26B, an oxidization process for rounding the corners of the gate electrode 103 is carried out. That is, oxide portions 105 are formed at the corners of the gate electrode 103.

This rounding process is effective especially in order to ease the concentration of the electric field at the corners of the gate electrode 103, and to recover the damages incorporated at the end of the gate insulation film 102 at the time of processing of the gate electrode 103 or an ion implantation for the extensions.

As illustrated in FIG. 26B, on the occasion of this oxidization process, $SiO_2$ films 104 and 105 of the usual thickness are formed on the surfaces of the semiconductor layer 100 and the gate electrode 103.

However, when high dielectric material, such as $ZrO_2$, $HfO_2$ and these silicates, mentioned above, is used as a gate insulating film 102, the thick interface oxidization layers 105 which include $SiO_2$ as the main ingredients are formed in the upper and lower sides of the gate insulating film 102.

When the gate length is long, or when the heat process for oxidization is short, the interface oxidization layer 105 such as the one shown in FIG. 26B is formed. This oxidation layer 105 has a shape of wedge whose thickness becomes thinner near the center of the gate. On the other hand, when the gate length is short, or when the heat process for oxidization is long, as shown in FIG. 26C, the thick uniform interface oxidization layers 105 which penetrate above and below the gate insulating film 102 from both sides are formed.

Such a phenomenon in which the interface oxidization layer 105 is formed in the upper and lower sides of the gate insulating film 102 does not appear when $SiO_2$ or SiON is used as the gate insulating film. This is a characteristic phenomenon which becomes remarkable, when high dielectric material, such as metal oxides, such as $ZrO_2$, $HfO_2$, and these silicates, is used. This phenomenon is considered to originate in a fact that oxygen (O) tends to diffuse in the gate insulating film using such high dielectric materials, compared with the case where $SiO_2$ and SiON are used, and the oxygen becomes active to oxidize the surrounding silicon.

However, since the interface oxidization layer 105 which consists of such a silicon oxide has the small dielectric constant, it has a bad influence on the property of the transistor obtained. Specifically, the following problems arise:

(1) A threshold becomes very high. Especially, when gate length (Lg) becomes short, the threshold becomes very high because the thickness of the interface oxidization layer 105 increases.

(2) Current driving force decreases.

(3) Properties, such as a threshold and driving force, vary from element to element.

Moreover, traps are apt to be generated in the interface of the gate insulating film 102 made of a high dielectric material and the interface oxidization layer 105 formed without being controlled in this way. Especially when the traps are generated at a drain corner, they serve as trap sites of hot carriers. For this reason, another problem that the reliability of a transistor is degraded is also produced.

In recent years, instead of polycrystalline silicon, metal or silicide may be used as a material of the gate electrode 103. In such a case, oxidization which is shown in FIGS. 26B or 26C may not necessarily be performed. However, even in such a case, CVD (Chemical Vapor Deposition) process for formation of a gate side wall is surely required. In this CVD process, the similar interface oxidization layer 105 as what was mentioned above about FIGS. 26B and 26C by the oxygen in atmosphere gas or the remaining oxygen in a vacuum is formed, and there is a possibility that the problem of degrading the operating characteristic and reliability of MISFET may arise.

SUMMARY OF THE INVENTION

This invention has been made based on recognition of these problems, and it is one of the objects of the invention to provide a semiconductor device which can reduce formation of an interface oxidization layer which was mentioned above, and its manufacture method, using a high dielectric material as a gate insulation film.

According to an embodiment of the invention, there is provided a semiconductor device comprising: a semiconductor layer having a source region and a drain region; a gate insulating film provided on the semiconductor layer between the source region and the drain region, the gate insulating film having a first end region near the source region and a second end region near the drain region and a center region between the first and second end regions, the gate insulating film comprising an oxide including a metal element, and the gate insulating film further including at least one element selected from the group consisting of nitrogen and aluminum as a first element, a content of the first element being relatively higher at the first and second end regions than at the center region of the gate insulating film; and a gate electrode provided on the gate insulating film.

According to other embodiment of the invention, there is provided a semiconductor device comprising: a semiconductor layer having a source region and a drain region; a gate insulating film provided on the semiconductor layer, the gate insulating film being made of an oxide including a metal element, and the gate insulating film further including at least one element selected from the group consisting of nitrogen and aluminum as a first element in a part adjoining an interface with the semiconductor layer, a content of the first element being relatively higher at both ends of the gate insulating film than at a center of the gate insulating film taken along a direction passing through the source region and the drain region; and a gate electrode provided on the gate insulating film.

According to other embodiment of the invention, there is provided a semiconductor device comprising: a semiconductor layer having a source region and a drain region; a gate insulating film provided on the semiconductor layer between the source region and the drain region, the gate insulating film being made of an oxide including a metal element; high concentration regions, each of the high concentration regions adjoining the gate insulating film at its end near the source region and at its end near the drain region respectively, the high concentration regions including at least one element selected from the group consisting of nitrogen and aluminum as a first element, and a content of the first element being relatively higher at the high concentration regions than at the gate insulating film; and a gate electrode provided on the gate insulating film and the high concentration regions.

The appended claims are based on the cross-sectional structure as shown in FIG. 1, for example. The claimed high concentration regions may be discrete. Alternatively, each of these high concentration regions may be a part of a single high concentration region formed continuously on the periphery of the gate insulating film. The claimed structure includes both of these cases.

According to other embodiment of the invention, there is provided a semiconductor device comprising: a semiconductor layer; a gate insulating film provided on the semiconductor layer, the gate insulating film being made of an oxide including a metal element; a gate electrode provided on the gate insulating film; a first oxide layer provided on a surface of the semiconductor layer surrounding the gate insulating film, the first oxide layer being made of an oxide of an element composing the semiconductor layer; and a second oxide layer provided on a side surface of the gate electrode, the second oxide layer being made of an oxide of an element composing the gate electrode, a thickness of the second oxide layer being equal to or smaller than a thickness of the first oxide layer.

According to other embodiment of the invention, there is provided a method of manufacturing a semiconductor device comprising: forming a first layer made of an oxide including a metal element on a semiconductor layer; forming a second layer made of a conductive material on the first layer; forming a gate electrode by selectively etching the second layer and forming a gate insulating film by selectively etching the first layer; introducing at least one element selected from the group consisting of nitrogen and aluminum from a side surface of the gate insulating film; and forming an oxide layer on the side surface of the gate electrode.

According to other embodiment of the invention, there is provided a method of manufacturing a semiconductor device comprising: forming a first layer made of an oxide including a metal element on a semiconductor layer; forming a second layer made of a conductive material on the first layer; forming a gate electrode by selectively etching the second layer; forming a gate insulating film by selectively etching the first layer until the gate insulating film recesses from the gate electrode; filling the recess with a material including at least one element selected from the group consisting of nitrogen and aluminum from a side surface of the gate insulating film; and forming an oxide layer on a side surface of the gate electrode.

According to other embodiment of the invention, there is provided a method of manufacturing a semiconductor device comprising: forming a first layer made of an oxide including a metal element on a semiconductor layer; forming a second layer made of a conductive material on the first layer; forming a gate electrode by selectively etching the second layer and forming a gate insulating film by selectively etching the first layer; and forming an oxide layer on a side surface of the gate electrode by exposing the side surface to an active oxygen.

In the specification, the term "lanthanoid elements" means rare earth elements having atomic numbers from 57 to 71, i.e., a Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), and Lutetium (Lu).

Diffusion constants of oxygen in the materials containing nitrogen, especially a nitride or oxide-nitride of silicon, or material containing aluminum, for example, aluminum oxide, aluminum nitride, or aluminum oxide-nitride, are smaller than a diffusion coefficient of oxygen in a silicon oxide. Therefore, by providing "high concentration region" which consist of such material in both ends of a gate insulation film, invasion and diffusion of oxygen from the ends of the gate can be prevented firmly compared with the case where metal oxide is exposed at the ends of the gate insulating film. As a result, it becomes possible to solve a problem that a undesirable interface oxidization layers are formed in the upper and lower sides of the gate insulation film by the unusual oxidization.

Moreover, by introducing nitrogen, silicon, aluminum, etc. into the ends of a gate insulating film, the relative dielectric constant of the gate insulating film at its ends naturally differs from the relative dielectric constant of the gate insulating film near the carrier running section of a transistor, i.e., the channel section. This has an advantage which is explained below.

First, when the relative dielectric constant of the high concentration region becomes lower, capacitive coupling of the source/drain and the gate electrode becomes weak. As a result, the load capacity of the transistor becomes smaller and the operation of the transistor becomes faster.

On the other hand, when the relative dielectric constant of the high concentration region becomes higher, it becomes possible to increase a current driving force using the effect that resistance of the extension regions of the source/drain becomes lower with the voltage of the gate.

Moreover, the reliability of a transistor against the hot carrier can be improved by the effect of lowering the electric field of the extension region. The relative dielectric constant of the high concentration region becomes either higher or lower Therefore, it is possible to choose and use an appropriate material suitably according to the role of a transistor.

On the other hand, in recent years, when using a material having a smaller band gap, such as the material containing a metal oxide, for a gate insulating film, the increase in power consumption due to the phenomenon that the hot carrier in a drain corner overcomes a barrier and flows into the gate, is posing a problem.

According to the invention, it becomes possible to arrange a material having a larger band gap only at the drain end, and thus, it becomes possible to prevent the increase in such power consumption, Furthermore, in recent years, when a material with a smaller band gap and smaller breakdown voltage, such as a material including a metal oxide, is provided at the gate corner where an electric field is especially strong, a destruction of the insulation film is being a problem.

According to the invention, it is possible to provide a material having a larger band gap only at the drain end, and thus, it becomes possible to solve such a problem of electrical breakdown.

Moreover, it is also one of the features of the invention that the nitrogen and aluminum of high concentration are intentionally incorporated in the gate insulating films only at the portion near the upper part of the extension section.

On the other hand, if nitrogen and aluminum are bonded with oxygen or are taken in a network of Si—O (silicon-oxygen), they will form a positive electric charge and a negative electric charge. Formation of such an electric charge changes a threshold of the transistor, or promotes dispersion of a carrier which runs near the gate insulation film, and may reduce a driving power of the transistor. In the embodiment, since high-concentration nitrogen and high-concentration aluminum are introduced into the gate insulation film only at the part above the extension region, there is no fear of causing such a problem.

On the other hand, if nitrogen and aluminum are bonded with oxygen or are taken in a network of Si—O, they may generate a trap center for an electric charge. If a majority of such traps exist, change of a threshold by a carrier being trapped may arise, or degradation of an insulating property as the whole gate insulation film may be caused. According to the embodiment, since high-concentration nitrogen and high-concentration aluminum are introduced only into the part above the extension region, it is also advantageous that such a degradation of the insulation film can be prevented.

Moreover, in the embodiment, active oxygen such as oxygen radical and oxygen ion can be used in the oxidization process for rounding the corners of a gate electrode. As a result, only the surface of a gate electrode can be oxidized efficiently, without making active oxygen trespass upon the inside of a gate insulating film. This effect becomes remarkable especially when the material having a dielectric constant higher than a silicon oxide, such as metal oxide, is used as a material of a gate insulating film.

In this case, the rounding-off process of a gate electrode can be carried out, preventing formation of an interface oxidization layer, even when a material which oxygen tends to invade and diffuse is used for the gate insulating film.

As explained above, according to the embodiment of the invention, the rounding-off process of a gate electrode can be carried out while preventing invasion of oxygen and preventing formation of an interface oxidization layers effectively by providing a high concentration region where the content of nitrogen or aluminum is higher near the both ends of the gate insulating film.

As the result, the semiconductor device which has the higher integration, higher performance and higher reliability can be realized by using a high dielectric material, while solving problems, such as a rise of a threshold, a fall of current driving force, or "fluctuation" of these properties.

Moreover, according to the embodiment of the invention, it becomes possible to prevent the generation of void while fully obtaining the thickness of the insulating film above an extension region by controlling the thickness of the insulating film at the side of a gate electrode to the same extent.

Moreover, according to an embodiment of the invention, only the surface of a gate electrode can be oxidized efficiently, without making oxygen trespass upon the inside of a gate insulating film by using active oxygen such as radical oxygen and oxygen ion in the oxidization process for rounding the corners of a gate electrode.

As the result, the semiconductor device which has the higher integration, higher performance and higher reliability can be realized by using a high dielectric material, while solving problems, such as a rise of a threshold, a fall of current driving force, or "fluctuation" of these properties.

Furthermore, the insulating film formed using the active oxygen in this way is better than the oxide film formed in a normal oxygen atmosphere, and is also excellent in elaborateness, insulating property, and interface levels.

As a result, the operating characteristic and reliability of semiconductor equipment can be improved further.

That is, according to embodiments of the invention, it becomes possible to provide a semiconductor device using a material which has a higher dielectric constant and having a higher degree of integration, and thus, the merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Figure 1:
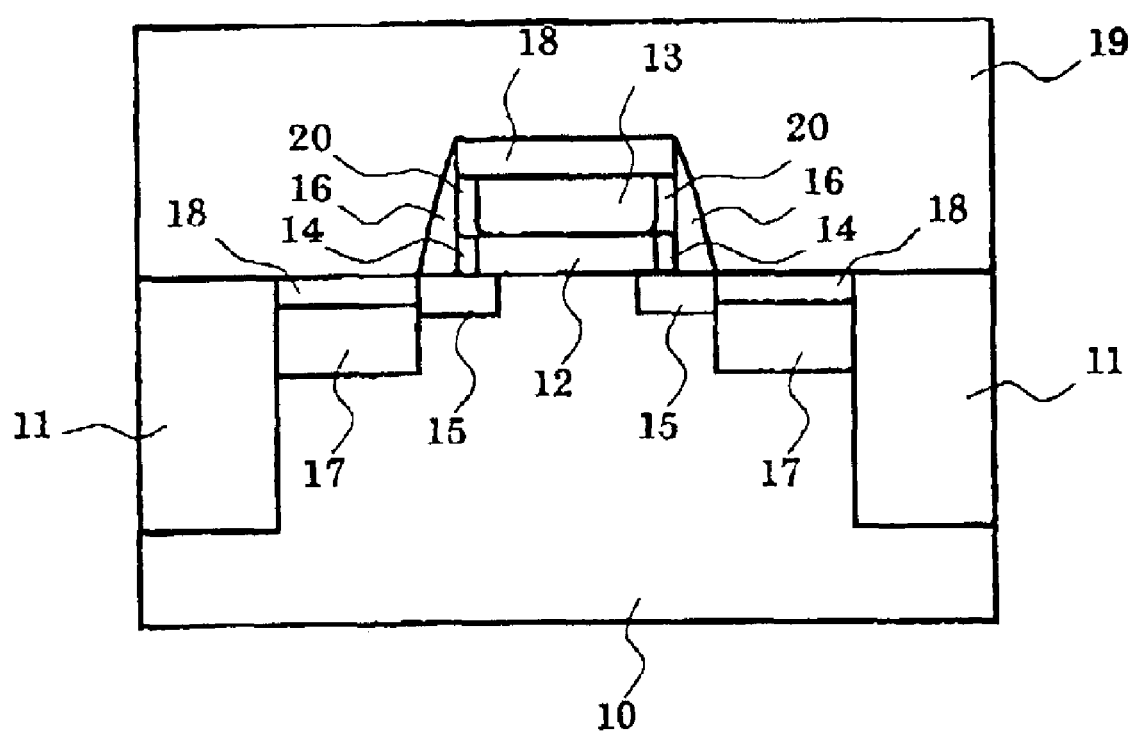
FIG. 1 is a schematic diagram which exemplifies the principal part cross-sectional structure of the semiconductor device according to the first embodiment of the invention.

Hereafter, some embodiments of the invention will now be explained in detail, referring to the drawings.

(First Embodiment)

FIG. 1 is a schematic diagram which exemplifies the principal part cross-sectional structure of the semiconductor device according to the first embodiment of the invention.

That is, the semiconductor device shown in this figure is an example obtained by applying the invention to MISFET structure. Isolation regions 11 are formed near the surface of the semiconductor layer 10, and the transistor is formed in the semiconductor portion separated by these regions 11. This transistor has the gate structure where the laminating of the gate insulating film 12 and the gate electrode 13 is carried out on the semiconductor layer 10.

Side walls 16 are formed in the both sides of the gate structure, and the source region 17 and the drain region 17 are formed in the outside. And the source extension region 15 and the drain extension region 15 are extending out from these source drain regions 17 towards the bottom of the gate electrode 13, respectively.

Furthermore, on the gate electrode 13 and the source drain regions 17 and 17, the contact layer 18 for obtaining contact to the electrodes which are not illustrated is formed. And the structure is covered with the insulating layer 19 and wirings are provided through the contact openings which are not illustrated.

In the structure explained above, the gate insulating film 12 is formed of high dielectric material having a dielectric constant higher than a silicon oxide. As such a high dielectric material, for example, oxide of lanthanoid elements, such as a hafnium oxide (HfOx), a zirconium oxide (ZrOx), or a lantern oxide (LaOx), can be mentioned. Moreover, a yttrium oxide $Y_2O_3$) and scandium oxide ($Sc_2O_3$) can also be mentioned. Furthermore, compounds (silicates) of these metal oxides and silicon, such as HfSiOx and ZrSiOx, can also be mentioned. Moreover, compound (or mixture) of these metal oxide and an aluminum oxide (AlOx) can also be mentioned.

On the other hand, as a material of the gate electrode 13, polycrystalline silicon can be used, for example. Both sides of the gate electrode 13 are covered with the oxide layer 20 formed by oxidizing a gate electrode. The oxide layer 20 is formed so that it extends toward inside along the interface with the gate insulating film 12. That is, the gate electrode 13 is formed in the shape whose lower corner is "rounded" to form a curved surface.

As will be explained in full detail later, this shape is realized by oxidizing the sides of the gate electrode 13 and forming an oxide layer 20. Thus, by making the lower corner of the gate electrode 13 into the shape of a curved surface, it becomes possible to ease concentration of an electric field and to improve the performance of a transistor And in this embodiment, the high concentration regions 14 and 14 are formed near the both ends of the gate insulating film 12. These high concentration regions 14 and 14 may be discrete. Alternatively, each of these high concentration regions 14 and 14 is a part of a single high concentration region formed continuously on the periphery of the gate insulating film 12. The invention includes both of these cases. However, in the following explanations will take the latter case where the high concentration region 14 is continuously formed on the periphery of the gate insulating film 12 for the sake of simplicity.

The high concentration region 14 has a content of nitrogen (N) higher than the content of nitrogen near the center of the gate insulating film 12. That is, in the high concentration region 14, at least a part of the metallic elements which constitute the gate insulating film 12, or silicon is combined with nitrogen. Such nitride of silicon (Si) or metallic elements has a lower diffusion coefficient of oxygen, and thus, a diffusion of oxygen is prevented.

Furthermore, the nitrogen contained in the high concentration region 14 has the tendency to combine stably with the silicon (Si) contained in the semiconductor layer 10 and the gate electrode 13 which adjoin the upper and lower sides of the gate insulating film 12. As a result, the elaborateness in the interface between the high concentration region 14 and the lower semiconductor layer 10, and in the interface between the high concentration region 14 and the upper gate electrode 13 is improved, and thus, invasion of the oxygen along these interfaces from the both ends of the gate insulating film 12 into the inside can be prevented effectively.

That is, in the process oxidizing the both sides of the gate electrode 13 to form the oxide layer 20, invasion of oxygen into the inside can be prevented by forming the high concentration region 14 at both ends of the gate insulating film 12. Thus, formation of the interface oxide layer 105 which was explained above with reference to FIGS. 26B and 26C can be prevented effectively. That is, by preventing formation of the interface oxidization layer 105, problems explained with reference to FIGS. 26B and 26C, such as a rise of a threshold, a fall of current driving force, or "fluctuation" of these properties can be solved, and a semiconductor device which has the higher integration, higher performance and higher reliability can be realized by using a high dielectric material.

Here, in this embodiment, since what is necessary is just to be able to prevent invasion of the oxygen from the both ends of the gate insulating film 12 in this way, the high concentration region 14 and the portion of the other gate insulating film 12 do not need to be divided clearly. That is, the high concentration region 14 may be formed by providing a continuous concentration distribution of nitride where the content of nitrogen increases relatively toward both ends in the gate insulating film 12.

In this case, there may need not be any step-like change of the content of nitrogen between the high concentration region 14 and the portion of the gate insulating film 12, and the content may change substantially continuously.

On the other hand, in the embodiment, it is also desirable that the high concentration region 14 includes not only nitrogen but silicon (Si) with a relatively higher content. The incorporated silicon (Si) bonds with nitrogen in the high concentration region 14, and invasion of oxygen can thereby be prevented more firmly.

It is also effective to introduce silicon by high concentration with nitrogen into the high concentration region 14, especially when a metal oxide which does not contain silicon is used as the material of the gate insulating film 12.

Moreover, it is also good to make the content of silicon become relatively higher in the high concentration region 14 than in the gate insulating film 12, even when a metal silicate oxide is used as the material of the gate insulating film 12.

Some of the metal nitrides are electrically conductive. Moreover, some of the nitrides have very low dielectric constants. In these cases, it is especially desirable to incorporate not only nitrogen but silicon (Si) by a high content into the high concentration region 14. The incorporated nitrogen and silicon bond each other in the high concentration region 14, and thus, a high insulation, a high dielectric constant and chemical stability can be obtained.

According to the embodiment, such high concentration region 14 is formed near the both ends of the gate insulating film 12. As a result, the portion of the gate insulating film 12 on the channel which serves as the carrier running section of a transistor (near the center of the gate insulating film 12) differs in a dielectric constant from the portion of the gate insulating film 12 on the extension regions 15 (on high concentration region 14). By providing such a distribution of the dielectric constant, the advantages which are explained below can be obtained.

First, when the dielectric constant of the high concentration region 14 becomes relatively lower, capacitive coupling of the source/drain regions 17 and the gate electrode 13 becomes weak, and thus, the load capacity of a transistor becomes smaller. As a result, the operation speed of the transistor can be made faster.

Contrary to this, when the dielectric constant of the high concentration region 14 becomes relatively higher, it becomes possible to increase current driving power using the effect that resistance of the extension regions 15 of the source/drain become lower with the voltage of the gate Moreover, the hot carrier reliability of a transistor can be improved according to the effect which lowers the electric field at the extension regions 15.

By incorporating a higher content of nitrogen, the relative dielectric constant of the high concentration region 14 may become either higher or lower. Such a change of the dielectric constant can be controlled by choosing suitably the element which constitutes the gate insulating film 12. Therefore, it is possible to use properly according to the role of the transistor needed in object semiconductor equipment.

On the other hand, in recent years, when using a material having a smaller band gap, such as the material containing a metal oxide, for a gate insulating film 12, the increase in power consumption due to the phenomenon that the hot carrier in a drain corner overcomes a barrier and flows into the gate, is posing a problem.

According to the invention, it becomes possible to arrange a material having a larger band gap as the high concentration region 14 only at the drain end, and thus, it becomes possible to prevent the increase in such power consumption. Furthermore, in recent years, when a material with a smaller band gap and smaller breakdown. voltage, such as a material including a metal oxide, is provided at the gate corner where an electric field is especially strong, a destruction of the insulating film is being a problem.

According to the invention, it is possible to provide a material having a larger band gap as the high concentration region 14 only at the drain end, and thus, it becomes possible to solve such a problem of electrical breakdown.

On the other hand, if nitrogen bonds with oxygen or is taken in a network of Si—O (silicon-oxygen), it will form a positive electric charge and a negative electric charge. Formation of such an electric charge changes a threshold of the transistor, or promotes dispersion of a carrier which runs near the gate insulation film, and may reduce a driving power of the transistor.

According to the embodiment, since high-concentration nitrogen is introduced into the gate insulation film only at the part above the extension region, there is no fear of causing such a problem. On the other hand, if nitrogen bonds with oxygen or is taken in a network of Si—O, it may generate a trap center of for electric charge. If a majority of such traps exist, change of a threshold by a carrier being trapped may arise, or degradation of an insulating property as the whole gate insulation film may be caused.

According to the embodiment, since high-concentration nitrogen is introduced only into the part above the extension region, it is also advantageous that such a degradation of the insulation film can be prevented.

Next, the manufacture method of the semiconductor device of the embodiment will be explained.

FIGS. 2A through FIG. 3D are process sectional views showing the principal part of the manufacture method of the semiconductor device of this embodiment.

Figure 2A:
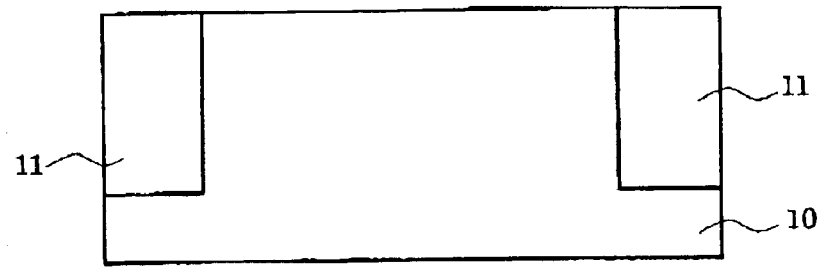
FIGS. 2A through FIG. 3D are process sectional views showing the principal part of the manufacture method of the semiconductor device of the first embodiment.

First, as shown in FIG. 2A, an isolation region 11 is formed in the surface of the silicon layer 10. Specifically, after trenching the surface of the silicon wafer for STI (Shallow Trench Isolation) at a depth of about 0.4 micrometers, an isolation region 11 is completed by depositing $SiO_2$ on the whole surface by the CVD method, and planarizing the whole surface by CMP (Chemical Mechanical Polishing), for example.

Figure 2B:
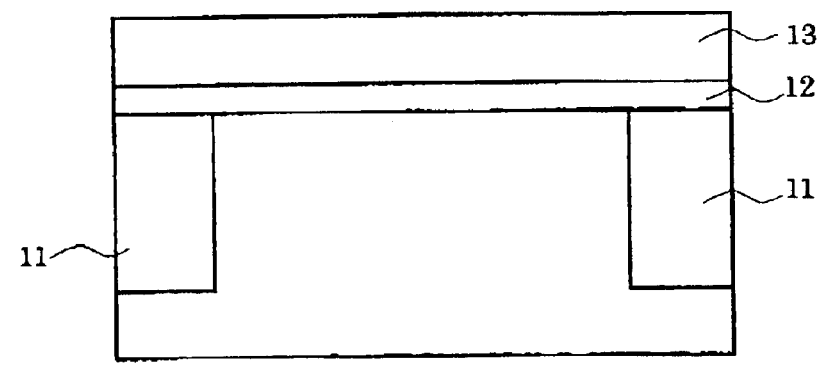

Next, as shown in FIG. 2B, the gate laminating structure is formed. Specifically, the film 12 of a mixture of a hafnium (Hf) oxide and a silicon oxide which becomes a gate insulating film, is deposited in about 5 nm thickness all over a wafer at 500 degrees in centigrade by the CVD method, for example.

Next, the polycrystalline silicon 13 used as a gate electrode is deposited by the CVD method.

Figure 2C:
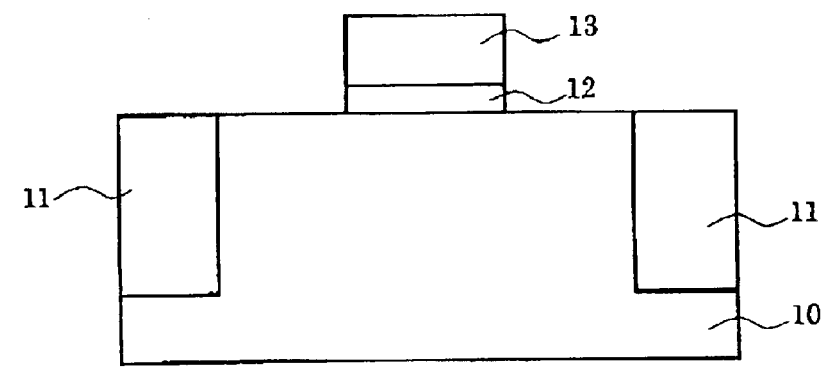

Next, as shown in FIG. 2C, a pattering process of the gate is carried out. Specifically, a mask (not shown) which specifies the position of the gate electrode 13 is formed by a photolithography process, and patterning of the gate electrode 13 is carried out by etching the polycrystalline silicon 13 by reactive ion etching (RIE) using a chloride gas (for example, mixture with BCl3, or BCl3 and HBr). Then, the gate insulating film 12 is etched by a dilute hydrofluoric acid by using the gate electrode 13 as a mask.

Figure 2D:
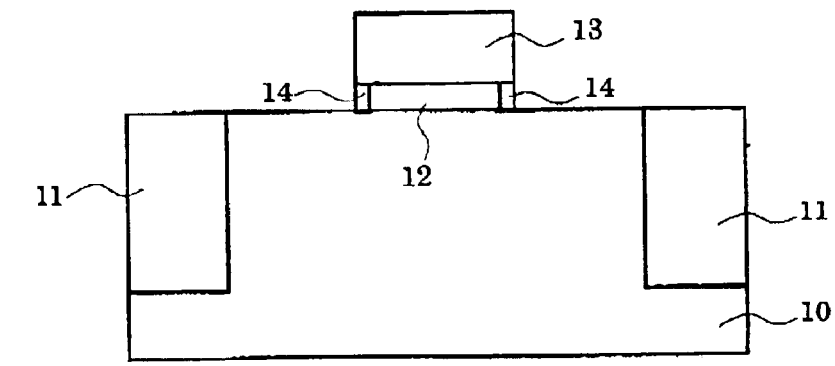

Next, as shown in FIG. 2D, the high concentration region 14 is formed near the both ends of the gate insulating film 12. Specifically, a nitrogen (N2) gas of about 10 Pa (Pascal) is introduced in a process chamber (not shown) at room temperature, and plasma nitriding process; for about 60 seconds is performed with an input power of 1 kW, for example. By this nitriding processing, nitrogen can be introduced into the portion whose width is about 5 nm in the both ends of the gate insulating film 12, and the high concentration region 14 can be formed. In this plasma nitriding processing, the content of the nitrogen in the high concentration region 14 can be made into about 10%.

Figure 3A:
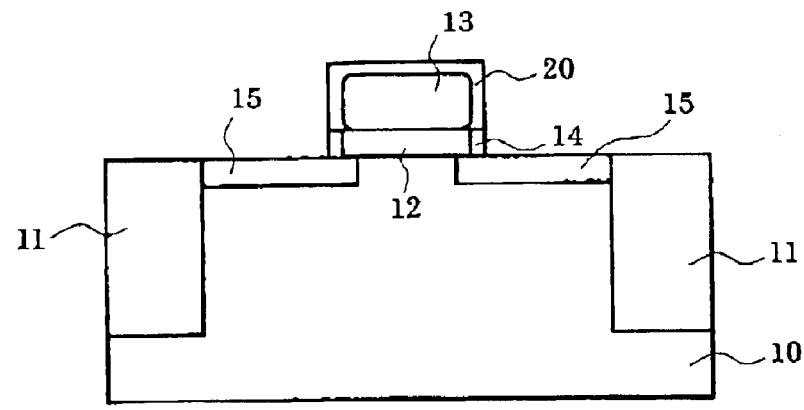

Next, as shown in FIG. 3A, the process for rounding the corners of the gate electrode 13 is carried out, and the extension regions 15 are formed further. Specifically, the exposed portions of the gate electrode 13 are oxidized or nitrided by a heat treatment in an oxygen atmosphere or in a nitrogen oxygen (NO) atmosphere, for example, and thus, the roundings are formed at the corners of the gate electrode 13.

In this process, by stably combining the nitrogen of the high concentration region 14 with the silicon (Si) contained in the semiconductor layer 10 and the gate electrode 13 of the upper and lower sides, the elaborateness of interfaces becomes higher and the invasion to the inside of the oxygen through these interfaces from the both ends of the gate insulating film 12 can be prevented effectively. As a result, formation of an interface oxide layer which was mentioned above with reference to FIGS. 26B and 26C can be prevented certainly. Then, the extension regions 15 are formed by introducing impurities, such as arsenic (As) and boron (B), by ion implantation, and diffusing and activating these impurities by heat treatment.

Figure 3B:
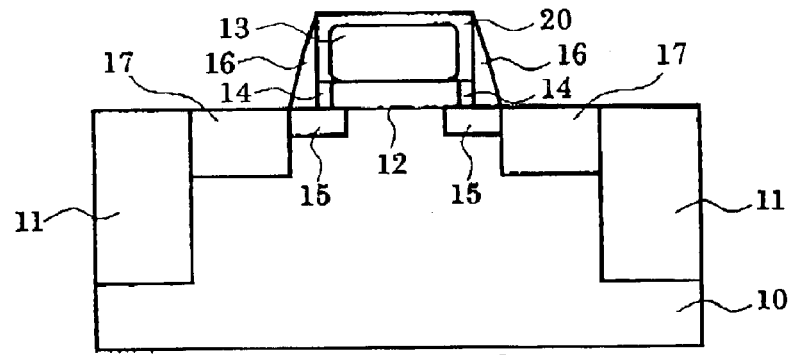

Next, as shown in FIG. 3B, side walls 16 are formed, and the source/drain regions 17 of the contact section are formed. Specifically, a silicon nitride (SiN) is first deposited on the whole wafer and the etching back process is carried out by reactive ion etching, for example, and thus, side walls 16 can be formed. Then, the source/drain regions 17 are formed by carrying out the ion implantation of the impurities, such as arsenic (As) and boron (B), and making it activated by subsequent heat treatment.

Figure 3C:
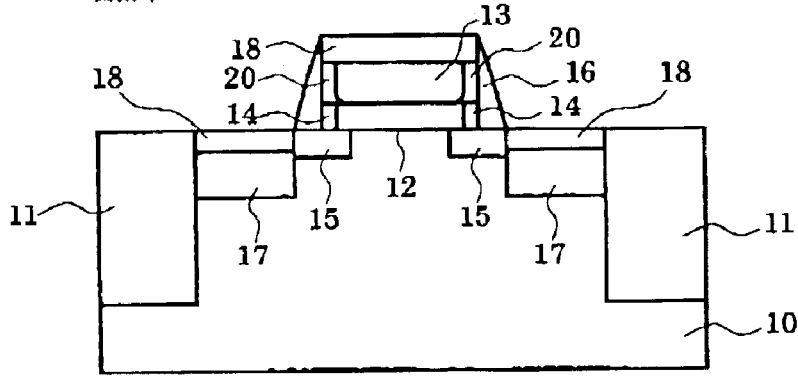

Next, as shown in FIG. 3C, the contact layer 18 is formed. Specifically, a nickel (nickel) is deposited on the whole wafer, and then, the contact layer 18 which consists of nickel silicide (NiSi) can be formed by making the nickel react with the silicon of the lower side. Alternatively, a nickel silicide layer can be deposited directly as the contact layer 18.

Figure 3D:
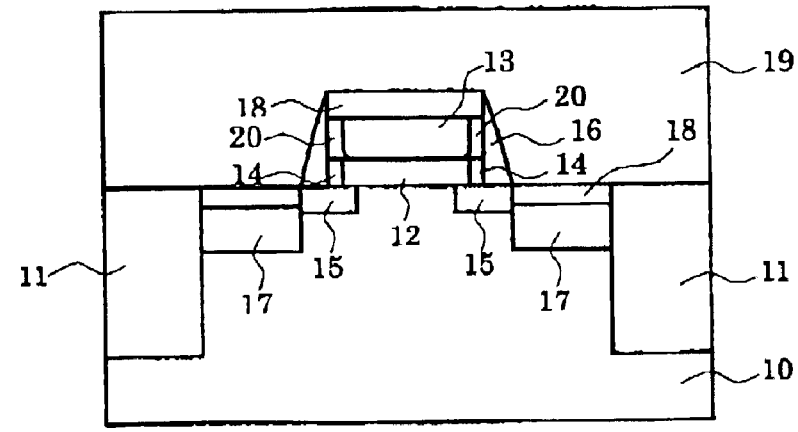

Then, as shown in FIG. 3D, an insulating film 19 is deposited and the principal part of a semiconductor device is completed by forming, suitably the contact holes and wirings which are not illustrated.

In the case of this example, the parts of the HfSiO gate insulating film right above the extension region 15 are nitrided, and the high concentration region 14 made of HfSiON is formed. The nitrogen contained in the high concentration region 14 is desirably bonded with silicon. The width of the transverse direction of the high concentration region 14 is about 5 nm, and the concentration of nitrogen thereof is raised to about 10%.

Figure 26A:
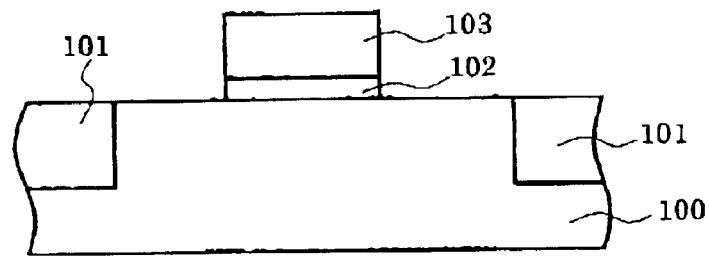
Figure 26B:
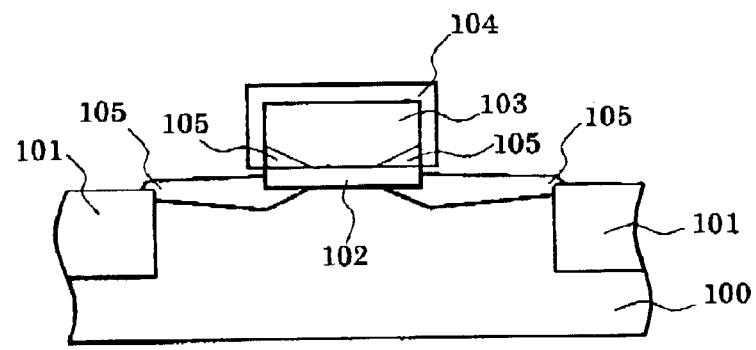
Figure 26C:
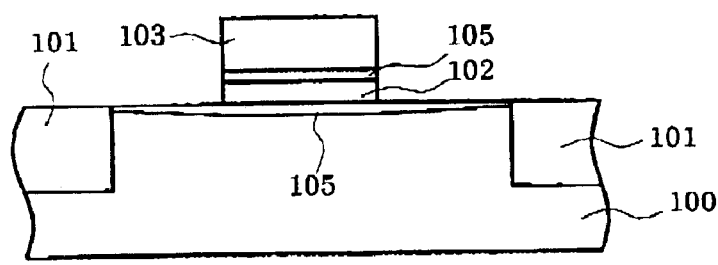

By forming such high concentration region 14, the abnormal oxidization along the upper and lower interfaces of the gate insulating film 12 is prevented in the subsequent process, and the interface oxide layer 105 which was shown in FIGS. 26B and 26C is not substantially formed.

As a result, the structure where the gate insulating film 12 joined to the channel section of the semiconductor layer 10 directly is obtained. That is, according to the embodiment, the high concentration region 14 can be formed certainly and easily by introducing nitrogen from the both ends of the gate insulating film 12. By using the semiconductor device which was formed in this way preventing the formation of interface oxide layers, a high integration can be realized while maintaining high performance and high reliability, as mentioned above with reference to FIG. 1.

In the embodiment, various kinds of conductive material, such as silicon germanium (SiGe), germanium (germanium), and nitride titanium (TiN), silicides of these materials, and germanium of there materials can be used instead of polycrystalline silicon as the material of the gate electrode 13. Moreover, as a material of the gate insulating film 12, various kinds of metal oxides or these silicates can be used similarly, as mentioned above concerning FIG. 1.

In order to introduce not only nitrogen but also silicon into the high concentration region 14, slanting ion implantation or side wall ion implantation technique can be employed, for example, as mentioned above with reference to FIG. 1.

In order to form the gate insulating film 12 as mentioned with reference to FIG. 2A, the MOCVD (Metal-Organic Chemical Vapor Deposition) method, the halide CVD method, the ALD method, the sputtering method, the vacuum depositing method, the ablation method, the wet applying method, or various kinds of other methods can be used as well.

Furthermore, during the formation process, radical or plasma can be applied, or catalyst reaction or irradiation of light can be used as well. In the plasma nitriding process mentioned above about FIG. 2D, plasma may be formed directly within the processing chamber which accommodates the wafer, or the plasma can be generated in the plasma generation chamber provided apart from the processing chamber and it may be introduced into the processing chamber.

In the case of the method of forming plasma directly in the processing chamber, the efficiency to nitride the side surfaces of the gate insulating film 12 may not be high, because the particles coming out from the plasma may incident to the substrate vertically.

Figure 4:
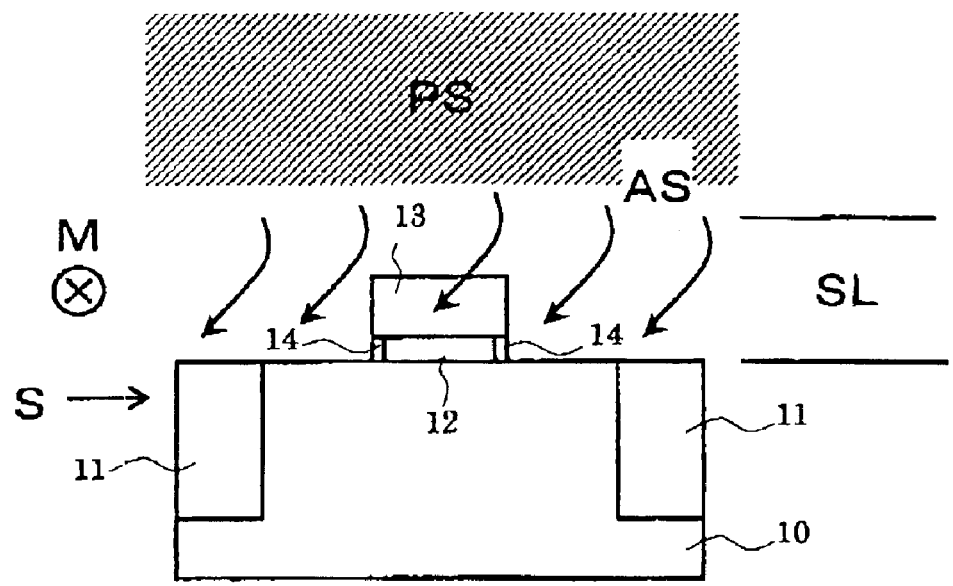
FIG. 4 exemplifies a method to apply a magnetic field M in a direction parallel to the substrate S, and thereby to deflect the direction of incidence of particles aslant.

In such a case, as exemplified in FIG. 4, it is effective to apply a magnetic field M in a direction parallel to the substrate S, and thereby to deflect the direction of incidence of particles AS aslant. That is, the active particles AS such as oxygen ions are provided from the plasma PS through the sheath layer SL. By applying the magnetic field M, these particles AS are deflected and effectively provided to the side surfaces of the substrate S.

Figure 5:
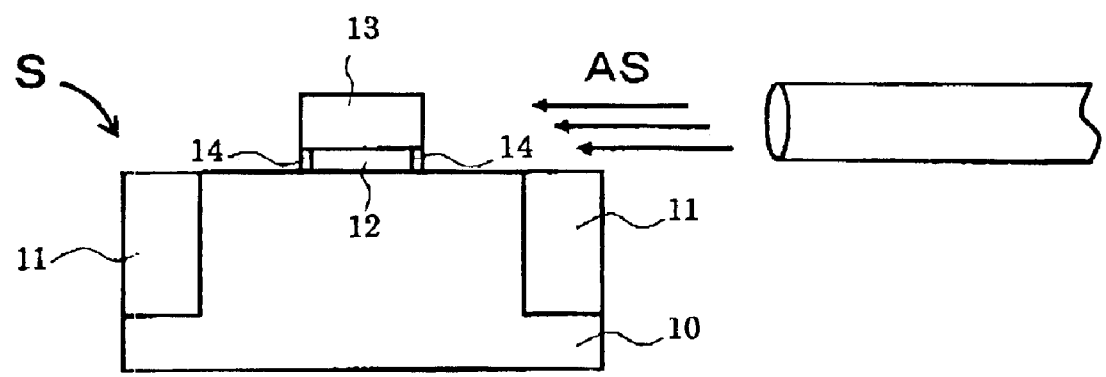
FIG. 5 shows the case where a plasma generation chamber apart from the processing chamber, and the nitridation is attained by installing substrate S horizontally to the direction of incidence of the radical particles.

On the other hand, when providing a plasma generation chamber apart from the processing chamber, as shown in FIG. 5, efficient nitridation can be attained by installing substrate S horizontally to the direction of incidence of the radical particles AS. Furthermore, also in the methods shown in FIGS. 4 and 5, nitrogen can be uniformly introduced by rotating the substrate S.

Moreover, on the occasion of nitriding process which is exemplified in FIGS. 4 and 5, by forming neutralization equipments, such as an electron gun (not shown), a neutral particle can be increased and the dielectric breakdown caused by the charge up can be prevented.

Moreover, after the nitrogen introduction process mentioned above with reference to FIG. 2D, a heat treatment may be carried out. Further, this heat treatment may be substituted by the annealing process performed after the ion implantation for the extension region. 15 in order to activate the implanted impurities or the annealing process performed after formation process of the side walls 16.

As a method to introduce impurity into the extension region 15, a layer such as silicon (Si) layer including the impurities can be deposited, and the extension region 15 is formed by a solid-phase diffusion from the silicon layer, for example.

Alternatively, it is also possible to dope impurities to $SiO_2$, SiON, etc. which constitute the gate side walls 16, and to form the extension region 15 by a solid-phase diffusion from these side walls 16 to the silicon surface.

On the other hand, the order of the nitrogen introduction process shown in FIG. 2D and the impurities introduction process of an extension region shown in FIG. 3A can be reverse.

Furthermore, as a material of the contact layer 18 mentioned above with reference tot FIG. 3C, it is possible to use various kinds of material including, for example, a cobalt silicide ($CoSi_2$) or a titanium silicide ($TiSi_2$) instead of the nickel silicide.

(Second Embodiment)

Next, the second embodiment of the invention will be explained.

Figure 6:
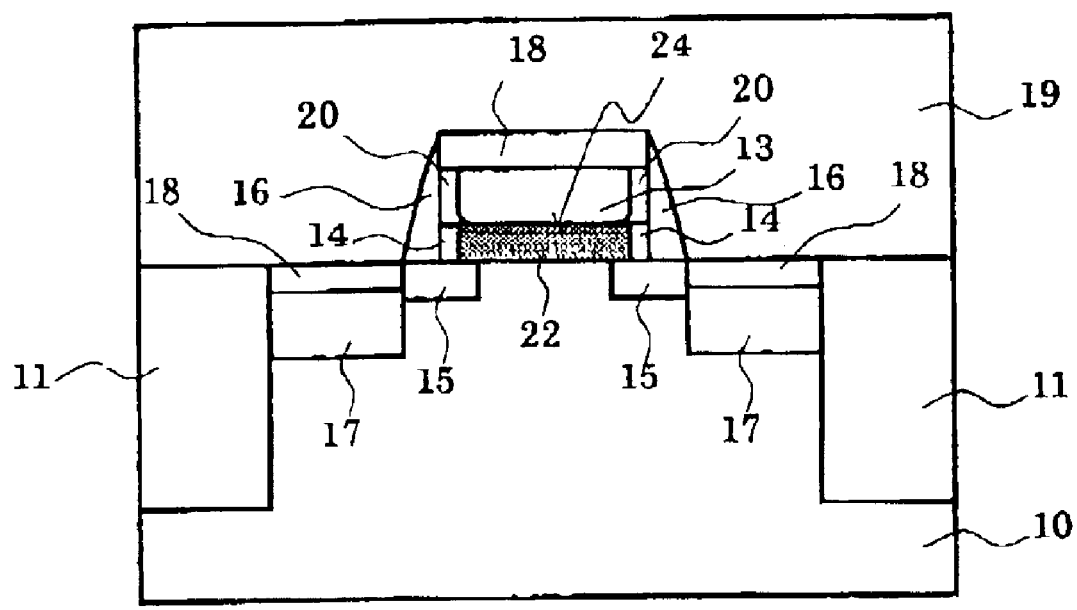
FIG. 6 is a schematic diagram which exemplifies the principal part cross-sectional structure of the semiconductor device according to the second embodiment.

FIG. 6 is a schematic diagram which exemplifies the principal part cross-sectional structure of the semiconductor device concerning the embodiment. The same symbols are given to the similar elements as what was mentioned above about FIGS. 1 through 5 about this figure, and detailed explanation is omitted.

Also in MISFET of this example, the gate insulating film 22 is formed of high dielectric material with a dielectric constant higher than a silicon oxide, like the case of the first embodiment. As mentioned above with reference to FIG. 1, as such high dielectric materials, lanthanoid elements, the oxides of various kinds of metals in addition to this, or these silicates can be used.

Also in this embodiment, the high concentration region 14 is provided in the both ends of the gate insulating film 22, like the first embodiment, and thus the content of nitrogen becomes higher in the high concentration region 14.

Furthermore, in this embodiment, the high concentration region 24 which contains nitrogen by higher concentration is formed in the surface side (side near the gate electrode 13) of this gate insulating film 22. That is, the nitrogen content of the gate insulating film 22 becomes higher in the vicinity of the gate electrode 13.

According to the embodiment, first, as mentioned above about the first embodiment, by establishing the high concentration region 14 in the both ends of the gate insulating film 22, invasion to the inside of oxygen can be prevented and formation of the interface oxide layer 105 which was mentioned above with reference to FIGS. 26B and 26C can be prevented effectively.

Furthermore, according to this embodiment, invasion of the oxygen through the interface of the gate insulating film 22 and the gate electrode 13 can be prevented still more firmly by establishing the high concentration region 24 where the concentration of nitrogen is higher in the surface side of the gate insulating film 22. That is, the nitrogen contained in the high concentration region 24 combines with the elements, such as silicon (Si) contained in the surface of the gate electrode 13, and thus the elaborateness of the interface is improved.

As a result, the invasion of the oxygen through the interface of the gate insulating film 12 and the gate electrode 13 can be prevented more certainly in the oxidization process for rounding the corners of the gate electrode 13. That is, formation of the interface oxide layer 105 which was shown in FIGS. 26B or 26C can be prevented certainly. And since this high concentration region 24 is formed in the side of the gate electrode 13 which is separated from the semiconductor layer 10, the influence on the running carrier by addition of nitrogen can also be prevented to the minimum extent.

FIGS. 7A through 8D are process sectional views showing the principal part of the manufacture method of the semiconductor device of this embodiment. The same symbols are given to the similar elements as what was mentioned above about FIGS. 1 through 6 also about these drawings, and the detailed explanation is omitted.

Figure 7A:
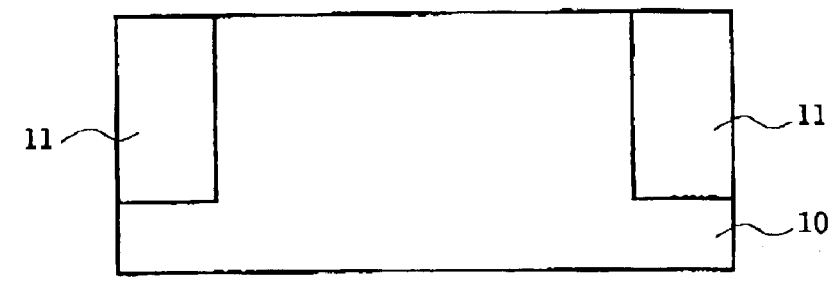
FIGS. 7A through 8D are process sectional views showing the principal part of the manufacture method of the semiconductor device of the second embodiment.

Also in this example, first, as shown in FIG. 7A, the isolation region 11, such as STI, are formed in the surface of the semiconductor layer 10.

Figure 7B:
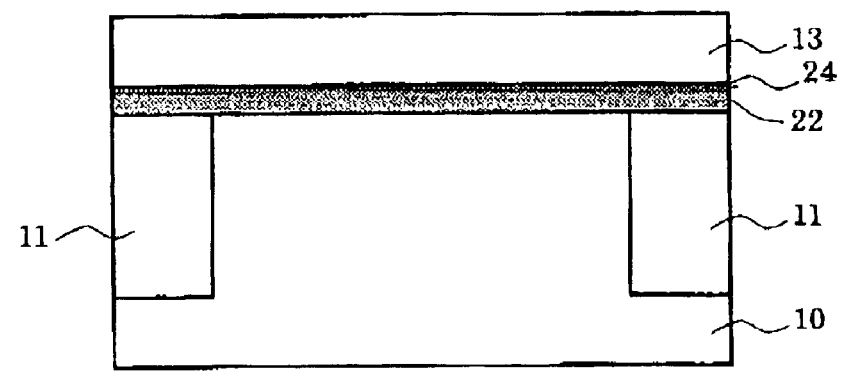

Next, as shown in FIG. 7B, the laminating structure of the gate insulating film 22 and the gate electrode 13 is formed.

For example, the hafnium silicon oxide (HfSiO) film 22 used as a gate insulating film is deposited in 5 nm thickness all over a wafer at 500 degrees C. by the CVD method. And nitriding process is performed to the surface of this oxide film, and thus, the high concentration region 24 is formed. Specifically, by exposing the surface of the HfSiO film 22 to a plasma for about 120 seconds in about 10 Pa nitrogen (N2) atmosphere at the input power of 30 W, the range of about 2 nm depth can be nitrided from the surface, and thus, the high concentration region 24 can be formed, for example.

It is necessary to take care that nitrogen does not enter too deep even near the interface of the gate insulating film 22 and the semiconductor layer 10 at this step.

Figure 7C:
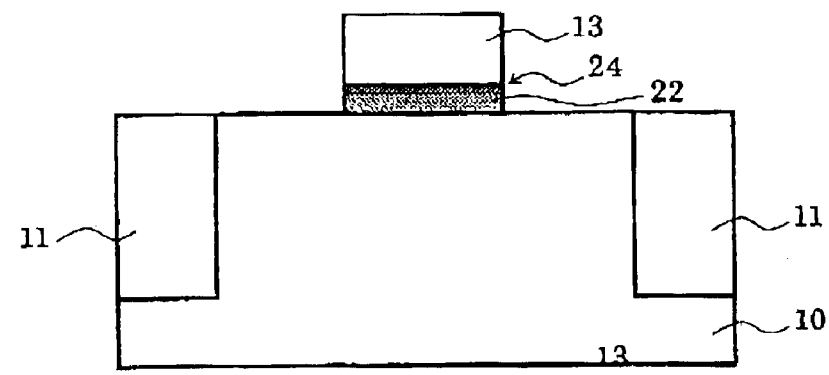

After the nitriding process of the surface of the gate insulating film 22, the polycrystalline silicon 13 is deposited by the CVD method as a gate electrode. Then, the process similar to the process mentioned above with reference to FIGS. 2C through FIG. 3D can be carried out. That is, as shown in FIG. 7C, patterning of the gate electrode 13 and the gate insulating film 22 is carried out.

Figure 7D:
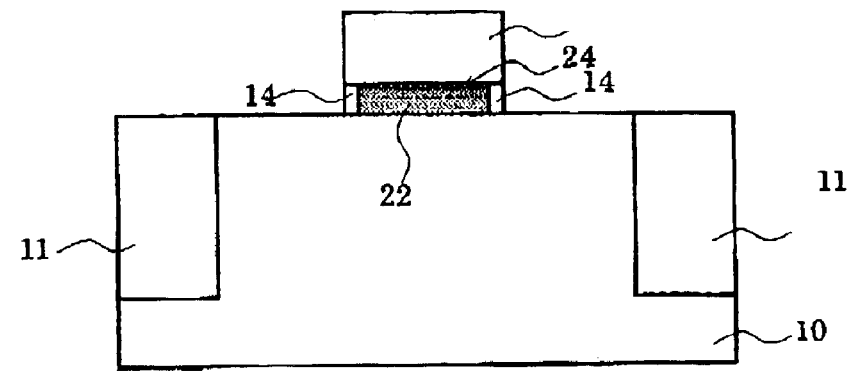

And as shown in FIG. 7D, the high concentration region 14 is formed in the both ends of the gate insulating film 22. The details of this step may be the same as that of what was mentioned above with reference to FIG. 2D. That is, as mentioned above, by introducing the nitrogen ($N_2$) about 10 Pa (Pascal) at room temperature, and performing plasma nitriding process for about 60 seconds by input power 1 kW, nitrogen can be introduced into the portions which is about 5 nm in width, and the high concentration region 14 is formed in the both ends of the gate insulating film 22.

In this plasma nitriding process, the content of the nitrogen in the high concentration region 14 can be made into about 10%.

Figure 8A:
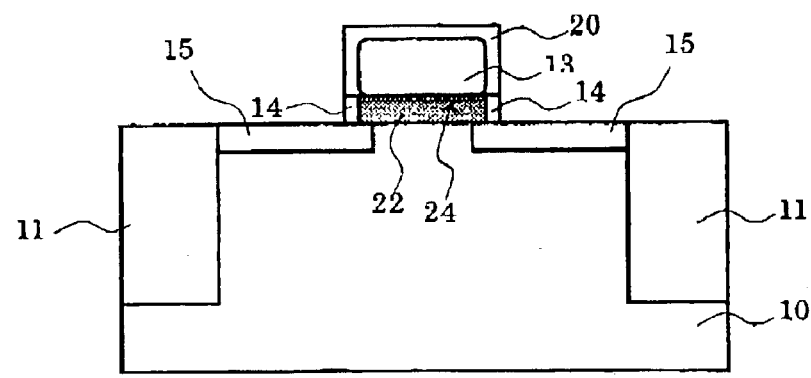

Next, as shown in FIG. 8A, the process which rounds the corners of the gate electrode 13 is carried out, and the extension regions 15 are formed further. Specifically, the exposed section of the gate electrode 13 is oxidized or nitrided by a heat treatment in an oxygen atmosphere or in a nitrogen oxygen (NO) atmosphere, and thus, the roundings are formed at the corners of the gate electrode 13.

In this process, invasion of the oxygen to the inside through the inside of the gate insulating film 12 or along the interfaces of the upper and lower sides can be effectively prevented by the high concentration regions 14 and 24 formed previously. That is, formation of an interface oxide layer which was mentioned above with reference to FIGS. 26B and 26C can be prevented certainly.

Figure 8B:
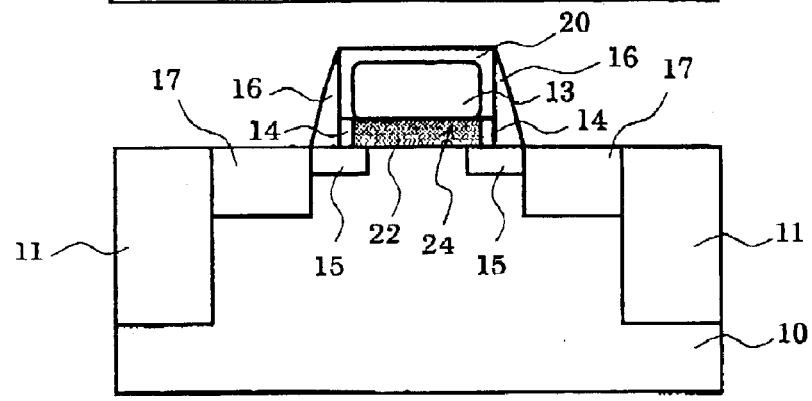

Next, as shown in FIG. 8B, side walls 16 are formed and the source/drain regions 17 of the contact section are formed further.

Figure 8C:
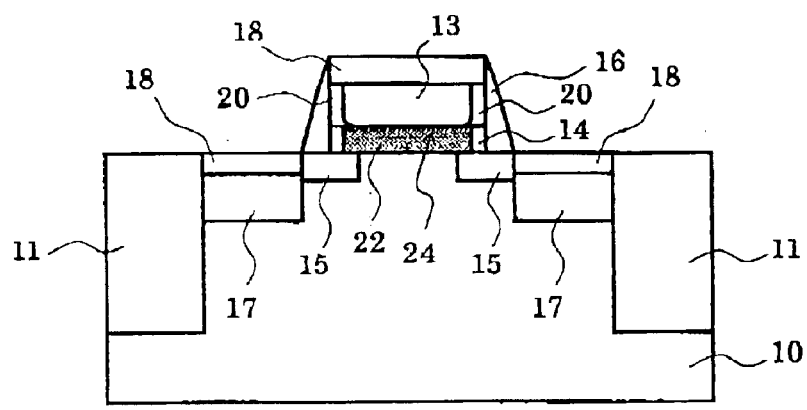
Figure 8D:
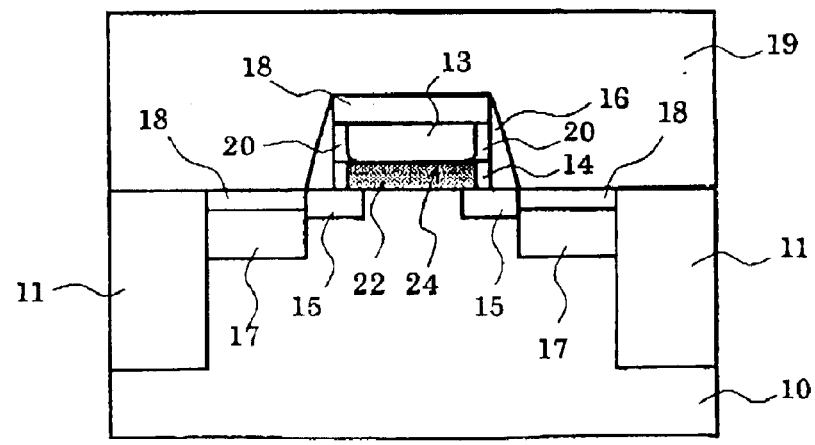

Then, as are shown to FIG. 8C, and the contact layer 18 is formed and as shown in FIG. 8D, an insulating film 19 is deposited, and the principal part of a semiconductor device is completed by forming suitably the contact holes and wirings which are not illustrated.

As explained above, in this embodiment, the high concentration region 24 can be formed by forming the gate insulating film 22 first and introducing a nitride into the surface of the film 22. After that, the high concentration region 14 can be formed by using the similar procedure as the first embodiment.

Also in this embodiment, not only nitrogen but also elements, such as silicon (Si), may be introduced in the steps to form the high concentration regions 14 and 24. That is, when the gate insulating film 22 consists of metal oxides, such as for example, an oxidization hafnium, by introducing nitrogen and silicon, combination of these nitrogen and silicon is formed in the gate insulating film 22, and it becomes possible to prevent invasion of oxygen more firmly.

Therefore, simultaneously with introduction of the nitrogen to the surface of the gate insulating film 22 in the process shown in FIG. 7B, silicon (Si) may be introduced on the surface of the gate insulating film 22. The introduction of silicon can be carried out simultaneously, before or after the introduction of nitrogen. In order to introduce these elements, the ion implantation with a lower acceleration energy or various kinds of other methods can be used.

In order to form the high concentration region 14 shown in FIG. 7D, the slanting ion implantation which is explained below as the third embodiment, or side surface ion implantation, for example, can be used to introduce silicon (Si) into the both ends of the gate insulating film 22.

(Third Embodiment)

Next, the third embodiment of the invention will be explained.

Figure 9:
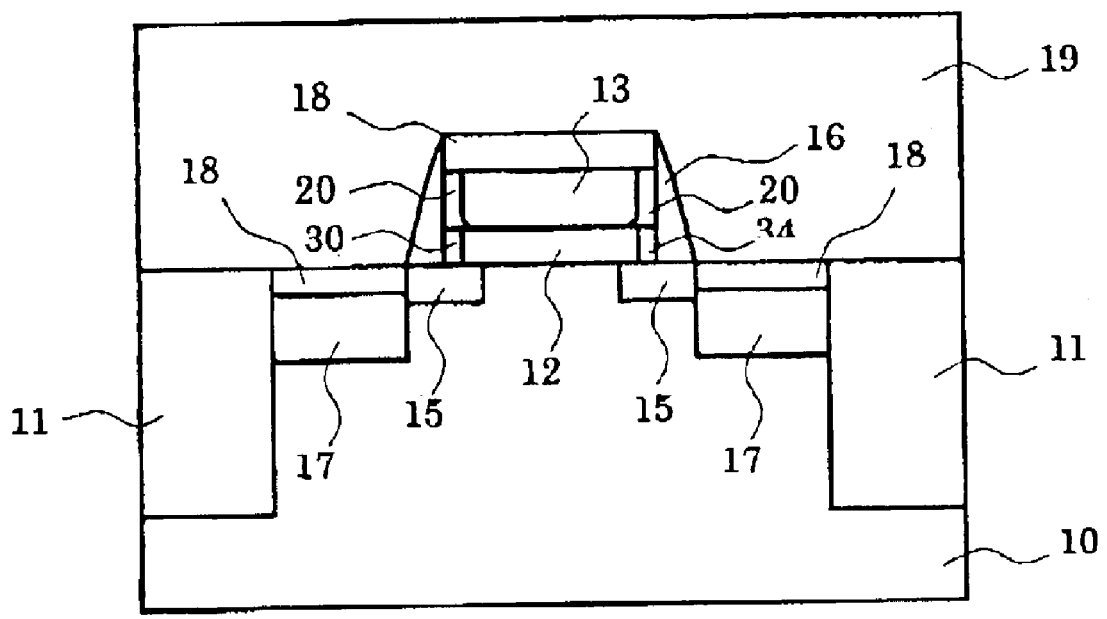
FIG. 9 is a schematic diagram which exemplifies the principal part cross-sectional structure of the semiconductor device according to the third embodiment.

FIG. 9 is a schematic diagram which exemplifies the principal part cross-sectional structure of the semiconductor device concerning this embodiment. The same symbols are given to the similar elements as what was mentioned above about FIGS. 1 through 8D also about this figure, and detailed explanation is omitted.

MISFET of this example has substantially the similar structure as the example mentioned above about the first embodiment. However, the formation method of the high concentration region 34 is different. That is, also in this embodiment, the gate insulating film 12 is formed of high dielectric material with a dielectric constant higher than a silicon oxide, like the case of the first embodiment As mentioned above with reference to FIG. 1 as such a high dielectric material, lanthanoid elements, the oxides of various kinds of metals, or these silicates can be used.

Also in this embodiment, the high concentration region 34 is provided in the both ends of the gate insulating film 12, like the first embodiment. The high concentration region 34 includes nitrogen with a relatively higher concentration. By forming such high concentration region 34, as mentioned above about the first embodiment, invasion of oxygen into the inside can be prevented and formation of the interface oxide layer 105 which was mentioned above with reference to FIGS. 26B can 26C be prevented effectively.

FIGS. 10A through 11D are process sectional views showing the principal part of the manufacture method of the semiconductor device of this embodiment. The same symbols are given to the similar elements as what was mentioned above with reference to FIGS. 1 through 9 also about these drawings, and the detailed explanation is omitted.

Figure 10A:
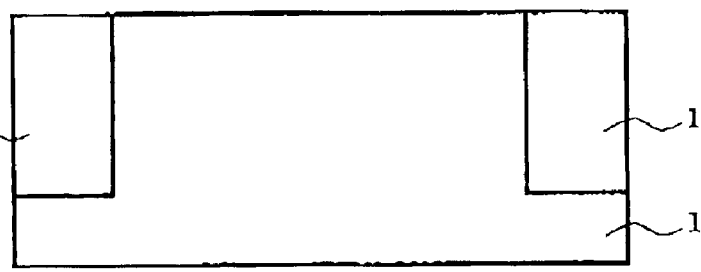
FIGS. 10A through 11D are process sectional views showing the principal part of the manufacture method of the semiconductor device of the third embodiment.

Also in this example, first, as shown in FIG. 10A, the isolation regions 11, such as STI, are formed in the surface of the semiconductor layer 10.

Figure 10B:
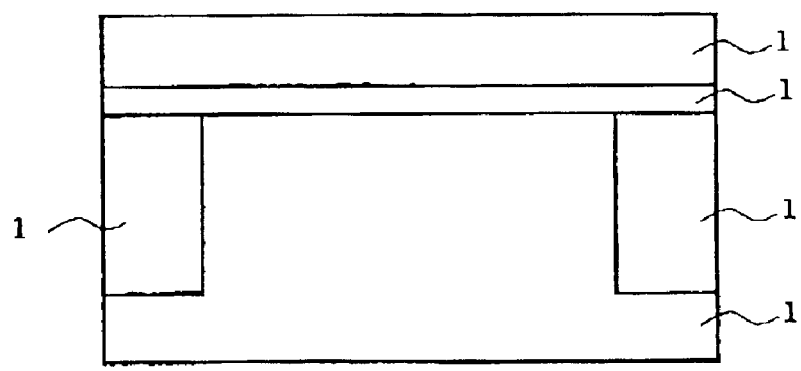

Next, as shown in FIG. 10B, the laminating structure of the gate insulating film 12 and the gate electrode 13 is formed. For example, an oxidization hafnium silicon (HfSiO) is deposited as the gate insulating film 12 and a polycrystalline silicon is deposited as the gate electrode 13, respectively.

Figure 10C:
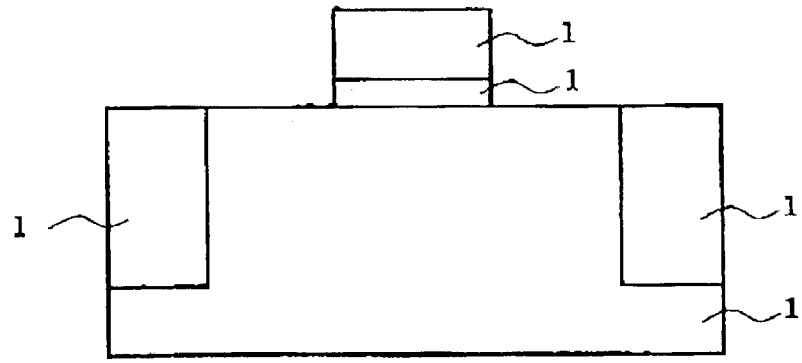

Next, as shown in FIG. 10C, patterning of the gate electrode 13 and the gate insulating film 12 is carried out.

Figure 10D:
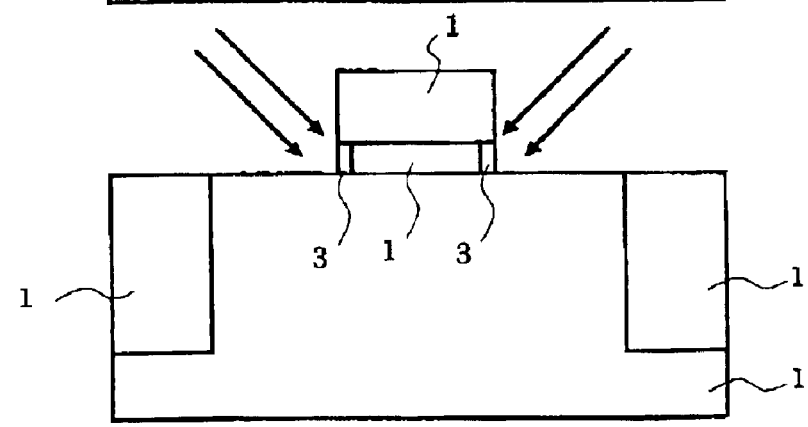

And as shown in FIG. 10D, the high concentration region 34 is formed in the both ends of the gate insulating film 12. In this embodiment, "slanting ion implantation" is used in this process. For example, the ion implantation of the nitrogen is carried out with the incident angle of about 60 degrees to the main surface of the semiconductor layer. The acceleration voltage may be about 1 kV, and the dose amount may be about $1 \times 10^{16} \text{cm}^{-2}$.

By this ion implantation, the high concentration region 34 where nitrogen was relatively introduced by high concentration in the both ends of the gate insulating film 12 covering a width of about 5 nm respectively can be formed. In the case of this example, the amount of peak introduction of the nitrogen in the high concentration region 34 may be about 10%.

Figure 11A:
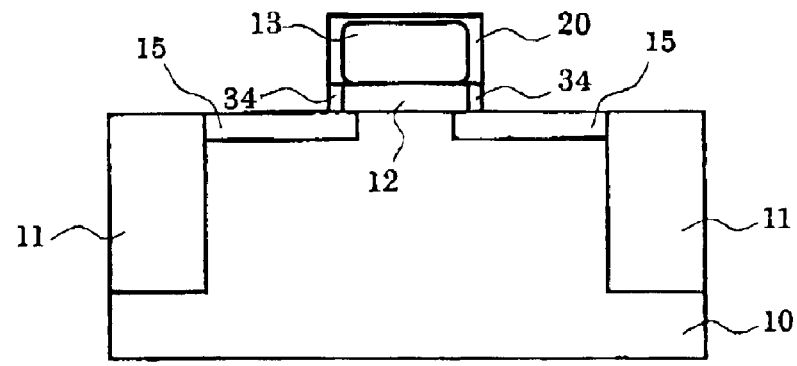

With regard to the following process, the process mentioned above with reference to FIGS. 2A through 3D may be employed. That is, as shown in FIG. 11A, the process which rounds the corners of the gate electrode 13 is carried out, and the extension region 15 is formed further. Specifically, the exposed section of the gate electrode 13 is oxidized or nitrided by a heat treatment in an oxygen atmosphere or in an nitrogen oxygen (NO) atmosphere, and thus, the roundings are formed at the corners of the gate electrode 13.

In this process, invasion of the oxygen to the inside through the inside of the gate insulating film 12 or along the interfaces of the upper and lower sides can be effectively prevented by the high concentration region 34 formed previously. That is, formation of an interface oxide layer which was mentioned above with reference to FIGS. 26B and 26C can be prevented certainly.

Next, as shown in FIG. 11 B, side walls 16 are formed and the source/drain regions 17 of the contact section are formed further. Then, as are shown to FIG. 11C, and the contact layer 18 is formed and as shown in FIG. 11D, an insulating film 19 is deposited, and the principal part of a semiconductor device is completed by forming suitably the contact holes and wirings which are not illustrated.

As explained above, in this embodiment, the high concentration region 34 can be formed by using a "slanting ion implantation". Also in this embodiment, not only nitrogen but also elements, such as silicon (Si), may be introduced in the steps to form the high concentration region 34. That is, when the gate insulating film 22 consists of metal oxides, such as for example, an oxidization hafnium, by introducing nitrogen and silicon, combination of these nitrogen and silicon is formed in the gate insulating film 22, and it becomes possible to prevent invasion of oxygen more firmly.

Figure 11B:
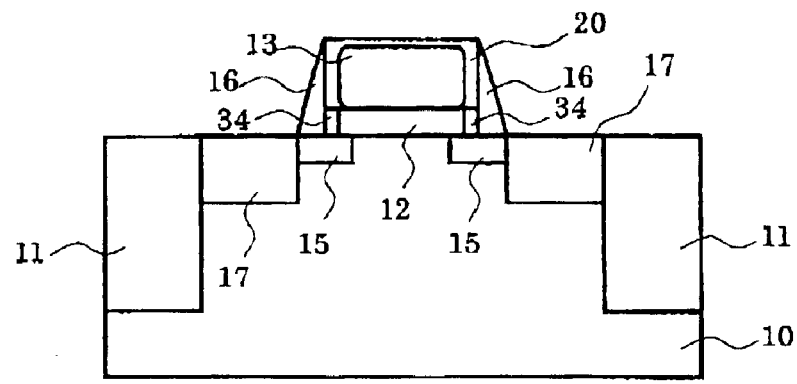
Figure 11C:
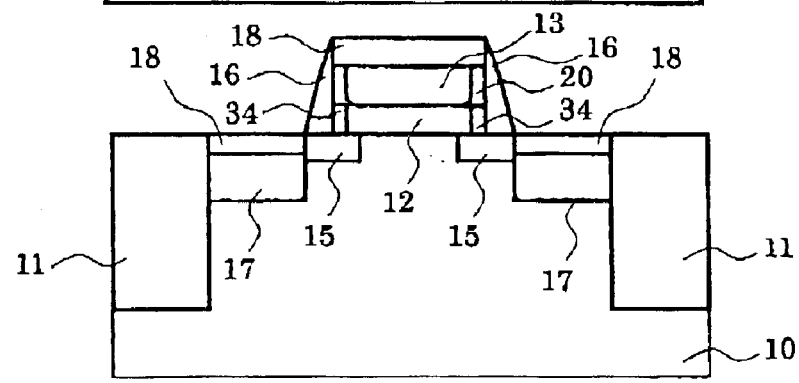
Figure 11D:
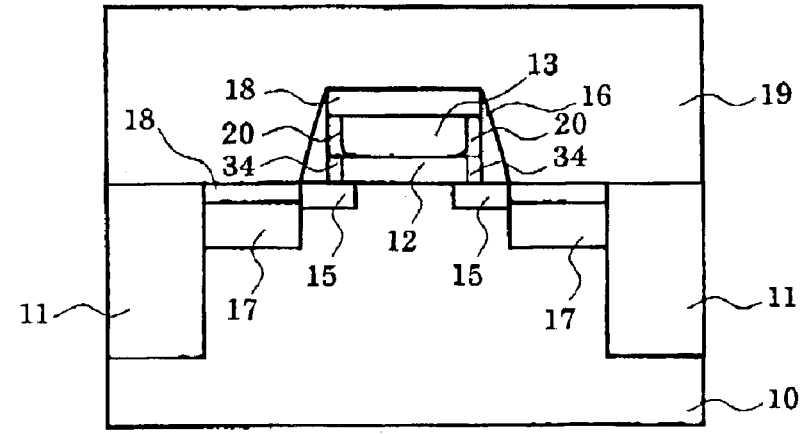

Therefore, simultaneously with introduction of the nitrogen to the surface of the gate insulating film 22 in the process shown in FIG. 11B, silicon (Si) may be introduced on the surface of the gate insulating film 22. The introduction of silicon can be carried out simultaneously, before or after the introduction of nitrogen. Various kinds of methods including the slanting ion implantation and a side surface ion implantation can be used in order to introduce silicon.

As explained above, according to this embodiment, nitrogen is introduced into the both ends of the gate insulating film 12 by slanting ion implantation, and it becomes possible to manufacture the semiconductor device while preventing a invasion of oxygen.

(Fourth Embodiment)

Next, the fourth embodiment of the invention will be explained.

Figure 12:
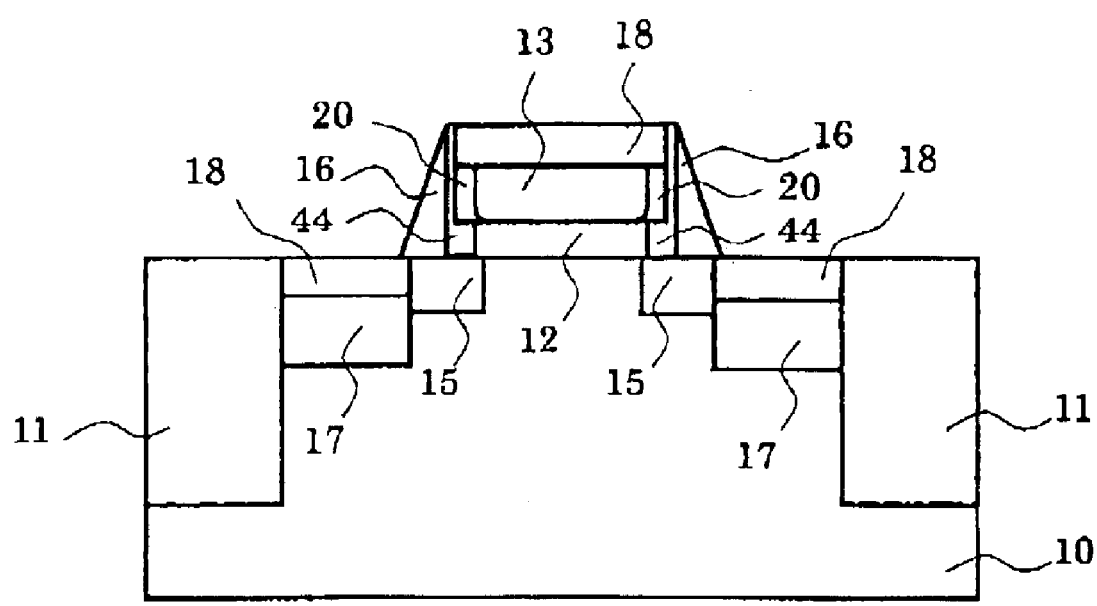
FIG. 12 is a schematic diagram which exemplifies the principal part cross-sectional structure of the semiconductor device according to the fourth embodiment.

FIG. 12 is a schematic diagram which exemplifies the principal part cross-sectional structure of the semiconductor device concerning the embodiment. The same symbols are given to the similar elements as what was mentioned above about FIGS. 1 through 11D also about this figure, and detailed explanation is omitted.

MISFET of this example has substantially the similar structure as the example mentioned above about the first embodiment. However, it differs at the point that the high concentration region 44 is formed by embedding materials such as silicon nitride from the side of the gate insulating film 12. That is, also in this embodiment, the gate insulating film 12 is formed of high dielectric material with a dielectric constant higher than a silicon oxide, like the case of the first embodiment.

As mentioned above with reference to FIG. 1 as such a high dielectric material, lanthanoid elements, the oxides of various kinds of metals, or these silicates can be used. Also in this embodiment, the high concentration region 44 is provided in the both ends of the gate insulating film 12, like the first embodiment. The high concentration region 44 includes nitrogen with a relatively higher concentration.

By forming such high concentration region 34, as mentioned above about the first embodiment, invasion of oxygen into the inside can be prevented and formation of the interface oxide layer 105 which was mentioned above with reference to FIGS. 26B can 26C be prevented effectively.

FIGS. 13A through 14D are process sectional views showing the principal part of the manufacture method of the semiconductor device of this embodiment. The same symbols are given to the similar elements as what was mentioned above with reference to FIGS. 1 through 12 also about these drawings, and the detailed explanation is omitted.

Figure 13A:
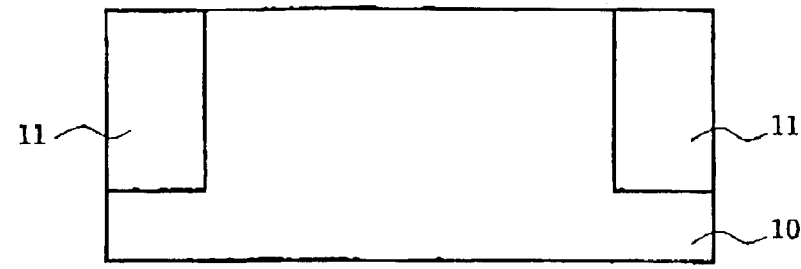
FIGS. 13A through 14D are process sectional views showing the principal part of the manufacture method of the semiconductor device of the fourth embodiment.

Also in this example, first, as shown in FIG. 13A, the isolation regions 11, such as STI, are formed in the surface of the semiconductor layer 10.

Figure 13B:
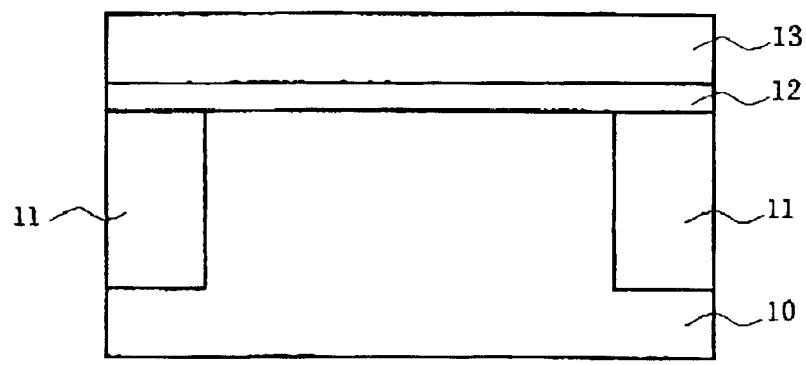

Next, as shown in FIG. 13B, the laminating structure of the gate insulating film 12 and the gate electrode 13 is formed. For example, an oxidization hafnium silicon (HfSiO) is deposited as the gate insulating film 12 and a polycrystalline silicon is deposited as the gate electrode 13, respectively.

Figure 13C:
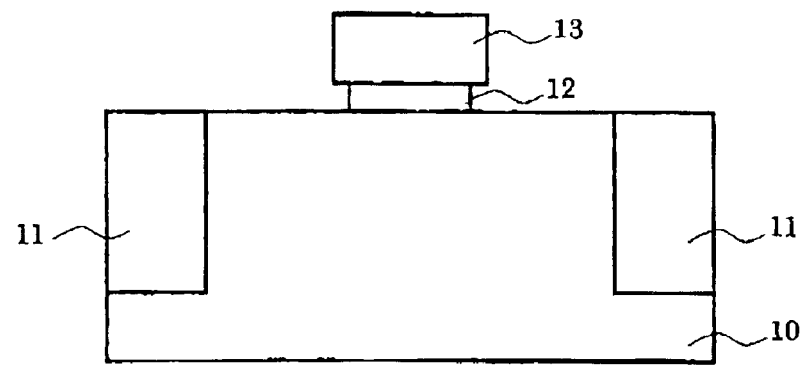

Next, as shown in FIG. 13C, patterning of the gate electrode 13 and the gate insulating film 12 is carried out. In this embodiment, in this process, side surfaces of the gate insulating film 12 are etched toward inside by a side etching, as shown in this figure. Specifically, a mask (not shown) which specifies the position of the gate electrode 13 is formed by a photolithography process, and patterning of the gate electrode 13 is carried out by etching the polycrystalline silicon 13 by reactive ion etching (RIE) using a chloride gas (for example, mixture with BCl3, or BCl3 and HBr).

Then, the gate insulating film 12 is etched by a dilute hydrofluoric acid by using the gate electrode 13 as a mask. In this step, a side etching of the gate insulating film 12 can be carried out by setting the etching time rather longer. For example, the side surfaces of the gate insulating film 12 may recess by about 5 nm from the side surfaces of the gate electrode 13.

Figure 13D:
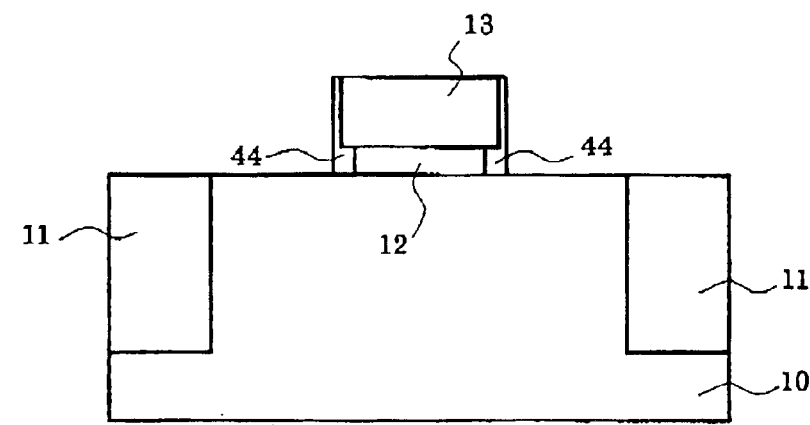

Next, the high concentration region 44 is embedded in the recesses, and thus the structure shown in FIG. 13D is formed. Specifically, a material which contains nitrogen, such as nitride silicon (SiN) of a thickness of about 7 nm is deposited all over the wafer by a method such as the sputtering or the CVD.

It is desirable to choose conditions under which oxidization does not proceed in the ends of the gate insulating film 12 on the occasion of this deposition process. This is because the ends of the gate insulating film 12 are not protected by the high concentration region yet, so there is a possibility that the interface oxide layer 105 which was mentioned above with reference to FIGS. 26B and 26C may be formed in this stage through the inside of the gate insulating film 12, and along the interface of the upper and lower sides when heating is carried out in the atmosphere containing oxygen.

Therefore, when oxygen is contained in the atmosphere in this deposition process, it is desirable to carry out the process in a room temperature or low temperature which is close to it.

After the material which contains nitrogen is deposited all over the wafer, the nitrogen containing material is removed by an anisotropic etching, such as a reactive ion etching (RIE), except the embedded portion at the recesses of both ends of insulating films 12. Thus, the high concentration region 44 which fills the recesses at the both ends of the gate insulating film 12 can be formed. According to this specific process, as shown in FIG. 13D, the thin layer 44 may remain on both side surfaces of the gate electrode 13. However, these thin layers 44 do not become the obstacle of the next process as explained below.

Figure 14A:
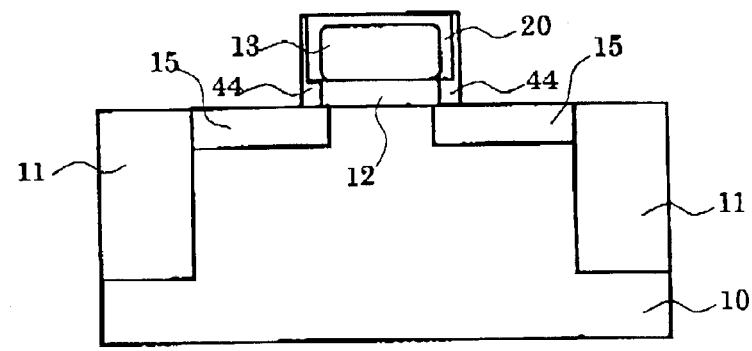

Next, as shown in FIG. 14A, the process for rounding the corners of the gate electrode 13 is carried out, and the extension regions 15 are formed further. Specifically, the exposed portions of the gate electrode 13 are oxidized or nitrided by a heat treatment in an oxygen atmosphere or in a nitrogen oxygen (NO) atmosphere, for example, and thus, the roundings are formed at the corners of the gate electrode 13.

In this process, invasion of the oxygen to the inside through the inside of the gate insulating film 12 or along the interfaces of the upper and lower sides can be effectively prevented by the high concentration region 44 formed previously. That is, formation of an interface oxide layer which was mentioned above with reference to FIGS. 26B and 26C can be prevented certainly.

The thin layers 44 which consist of nitrogen containing material may remain on the side surfaces of the gate electrode 13 as mentioned above. However, since the thickness of these layer is very small, it does not block the advance of oxidization of the side surfaces of the gate electrode 13 substantially.

Figure 14B:
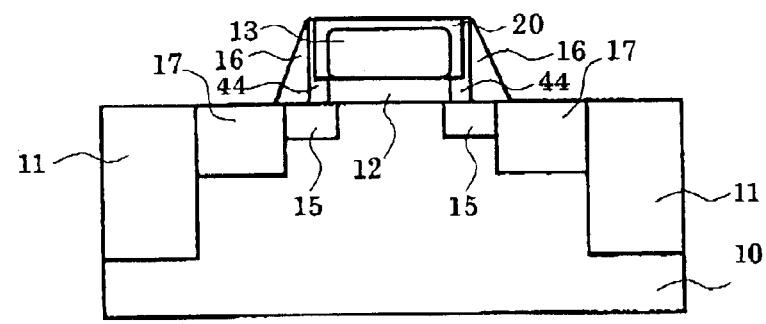

Next, as shown in FIG. 14B, side walls 16 are formed and the source/drain regions 17 of the contact section are formed further.

Figure 14C:
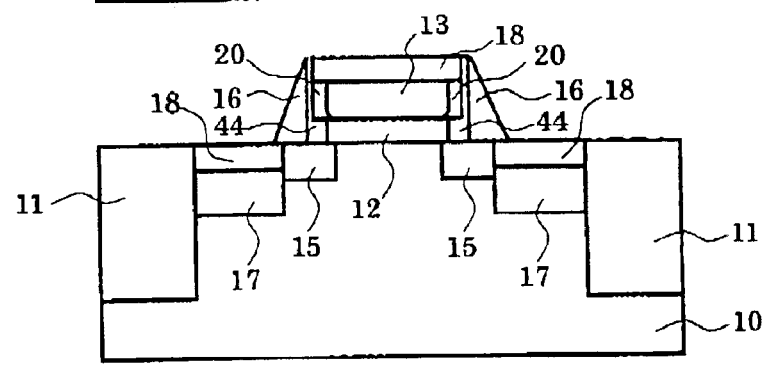
Figure 14D:
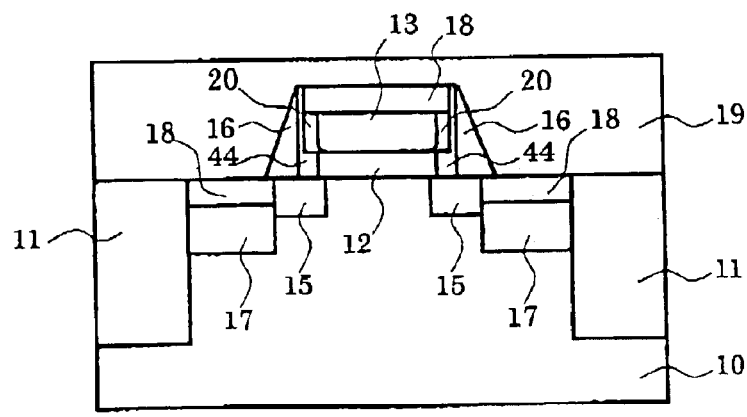

Then, as are shown to FIG. 14C, and the contact layer 18 is formed and as shown in FIG. 14D, an insulating film 19 is deposited, and the principal part of a semiconductor device is completed by forming suitably the contact holes and wirings which are not illustrated.

As explained above, in this embodiment, the high concentration region 44 can be formed by carrying out side etching of the gate insulating film 12 to form recesses, and embedding nitrogen containing material, such as nitride silicon, in the recesses. Thus, as well as the first through third embodiment, the high concentration region 44 also prevents invasion of oxygen firmly, and has the function which effectively prevent the formation of an interface oxide layer which was mentioned above with reference to FIGS. 26B and 26C.

(Fifth Embodiment)

Next, the fifth embodiment of the invention will be explained.

Figure 15:
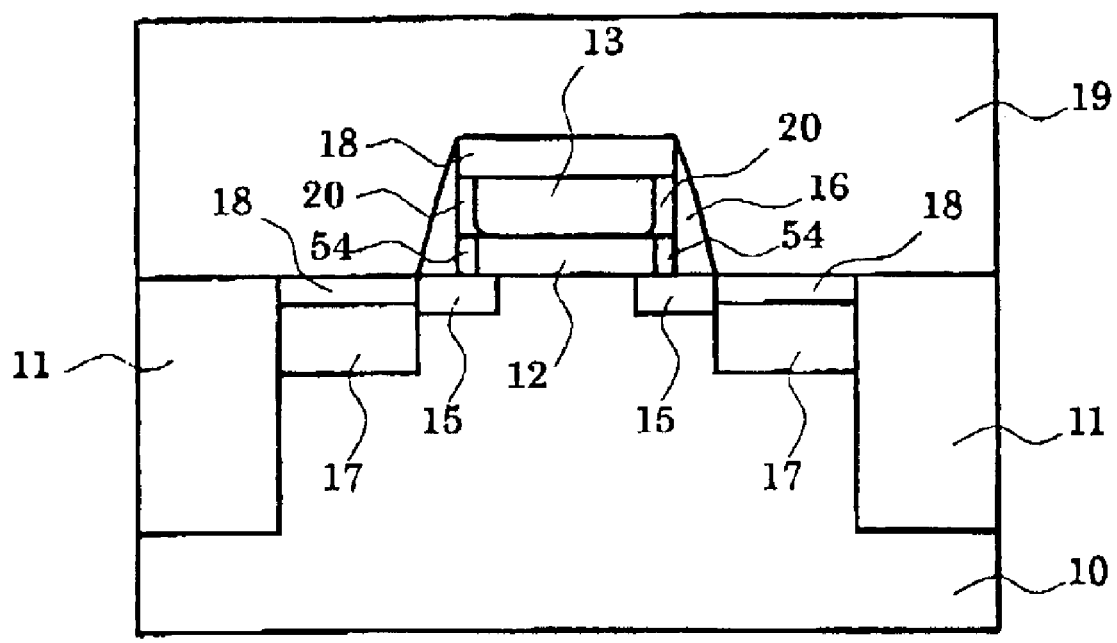
FIG. 15 is a schematic diagram which exemplifies the principal part cross-sectional structure of the semiconductor device according to the fifth embodiment.

FIG. 15 is a schematic diagram which exemplifies the principal part cross-sectional structure of the semiconductor device concerning the embodiment. The same symbols are given to the similar elements as what was mentioned above about FIGS. 1 through 14D about this figure, and detailed explanation is omitted.

In the case of the MISFET of this example, the high concentration region 54 which contains aluminum by higher concentration is formed in the both ends of the gate insulating film 12. Since the aluminum included in the high concentration region 54 has very active to oxygen, it combines with the invading oxygen preferentially and it has the function which reduces the diffusion of oxygen.

Furthermore, the aluminum contained in the high concentration region 54 has the tendency to combine stably with the silicon (Si) contained in the semiconductor layer 10 and the gate electrode 13 which adjoin the upper and lower sides of the gate insulating film 12.

As a result, the elaborateness in the interface between the high concentration region 54 and the lower semiconductor layer 10, and in the interface between the high concentration region 54 and the upper gate electrode 13 is improved, and thus, invasion of the oxygen along these interfaces from the both ends of the gate insulating film 12 into the inside can be prevented effectively. That is, in the process oxidizing the both sides of the gate electrode 13 to form the oxide layer 20, invasion of oxygen into the inside can be prevented by forming the high concentration region 54 at both ends of the gate insulating film 12. That is, by preventing formation of the interface oxidization layer 105, problems explained with reference to FIGS. 26B and 26C, such as a rise of a threshold, a fall of current driving force, or "fluctuation" of these properties can be solved, and a semiconductor device which has the higher integration, higher performance and higher reliability can be realized by using a high dielectric material.

Here, in this embodiment, since what is necessary is just to be able to prevent invasion of the oxygen from the both ends of the gate insulating film 12 in this way, the high concentration region 54 and the portion of the other gate insulating film 12 do not need to be divided clearly. That is, the high concentration region 54 may be formed by providing a continuous concentration distribution of nitride where the content of nitrogen increases relatively toward both ends in the gate insulating film 12. In this case, there may need not be any step-like change of the content of nitrogen between the high concentration region 54 and the portion of the gate insulating film 12, and the content may change substantially continuously.

On the other hand, in the embodiment, it is also desirable that the high concentration region 54 include not only aluminum but nitrogen (N) with a relatively higher content.

Further, silicon (Si) may be incorporated into the high concentration region 54. The incorporated nitrogen or silicon bonds with aluminum in the high concentration region 54, and invasion of oxygen can thereby be prevented more firmly.

It is also effective to introduce nitrogen and/or silicon by high concentration with aluminum into the high concentration region 54, especially when a metal oxide which does not contain silicon is used as the material of the gate insulating film 12.

Moreover, it is also good to make the content of nitrogen and/or silicon become relatively higher in the high concentration region 54 than in the gate insulating film 12, even when a metal silicate oxide is used as the material of the gate insulating film 12.

In this embodiment, by incorporating aluminum, the high concentration region 54 may become electrically conductive. Moreover, by adding aluminum, the dielectric constant of the high concentration region 54 may become smaller.

In these cases, it is especially desirable to incorporate not only aluminum but also nitrogen and/or silicon by a high content into the high concentration region 54. The incorporated nitrogen and silicon bond each other in the high concentration region 54, and thus, a high insulation, a high dielectric constant and chemical stability can be obtained.

According to the embodiment, such high concentration region 54 is formed near the both ends of the gate insulating film 12. As a result, the portion of the gate insulating film 12 on the channel which serves as the carrier running section of a transistor (near the center of the gate insulating film 12) differs in a dielectric constant from the portion of the gate insulating film 12 on the extension regions 15 (on high concentration region 54). By providing such a distribution of the dielectric constant, the advantages which are explained below can be obtained:

First, when the dielectric constant of the high concentration region 54 becomes relatively lower, capacitive coupling of the source/drain regions 17 and the gate electrode 13 becomes weak, and thus, the load capacity of a transistor becomes smaller. As a result, the operation speed of the transistor can be made faster.

Contrary to this, when the dielectric constant of the high concentration region 54 becomes relatively higher, it becomes possible to increase current driving power using the effect that resistance of the extension regions 15 of the source/drain become lower with the voltage of the gate.

Moreover, the hot carrier reliability of a transistor can be improved according to the effect which lowers the electric field at the extension regions 15.

By incorporating a higher content of aluminum, the relative dielectric constant of the high concentration region 54 may become either higher or lower. Such a change of the dielectric constant can be controlled by choosing suitably the element which constitutes the gate insulating film 12. Therefore, it is possible to use properly according to the role of the transistor needed in object semiconductor equipment.

On the other hand, in recent years, when using a material having a smaller band gap, such as the material containing a metal oxide, for a gate insulating film 12, the increase in power consumption due to the phenomenon that the hot carrier in a drain corner overcomes a barrier and flows into the gate, is posing a problem.

According to the invention, it becomes possible to arrange a material having a larger band gap as the high concentration region 54 only at the drain end, and thus, it becomes possible to prevent the increase in such power consumption.

Furthermore, in recent years, when a material with a smaller band gap and smaller breakdown voltage, such as a material including a metal oxide, is provided at the gate corner where an electric field is especially strong, a destruction of the insulating film is being a problem.

According to the invention, it is possible to provide a material having a larger band gap as the high concentration region 54 only at the drain end, and thus, it becomes possible to solve such a problem of electrical breakdown.

On the other hand, if aluminum bonds with oxygen or is taken in a network of Si—O (silicon-oxygen), it will form a positive electric charge and a negative electric charge. Formation of such an electric charge changes a threshold of the transistor, or promotes dispersion of a carrier which runs near the gate insulation film, and may reduce a driving power of the transistor.

According to the embodiment, since high-concentration aluminum is introduced into the gate insulation film only at the part above the extension region, there is no fear of causing such a problem. On the other hand, if aluminum bonds with oxygen or is taken in a network of Si—O, it may generate a trap center of for electric charge. If a majority of such traps exist, change of a threshold by a carrier being trapped may arise, or degradation of an insulating property as the whole gate insulation film may be caused.

According to the embodiment, since high-concentration aluminum is introduced only into the part above the extension region, it is also advantageous that such a degradation of the insulation film can be prevented.

Next, the manufacture method of the semiconductor device of the embodiment will be explained. FIGS. 16A through FIG. 17D are process sectional views showing the principal part of the manufacture method of the semiconductor device of this embodiment. The same symbols are given to the similar elements as what was mentioned above about FIGS. 1 through 6 also about these drawings, and the detailed explanation is omitted.

Figure 16A:
FIGS. 16A through FIG. 17D are process sectional views showing the principal part of the manufacture method of the semiconductor device of the fifth embodiment.

Also in this example, first, as shown in FIG. 16A, the isolation regions 11, such as STI, are formed in the surface of the semiconductor layer 10.

Figure 16B:
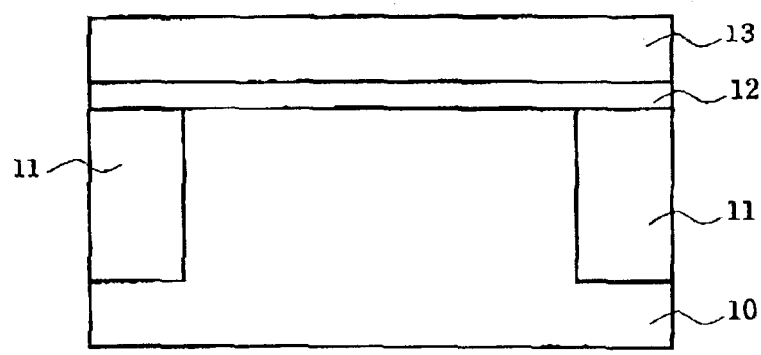

Next, as shown in FIG. 16B, the laminating structure of the gate insulating film 22 and the gate electrode 13 is formed. For example, the hafnium silicon oxide (HfSiO) film 22 used as a gate insulating film is deposited in 5 nm thickness all over a wafer at 500 degrees in centigrade by the CVD method.

Figure 16C:
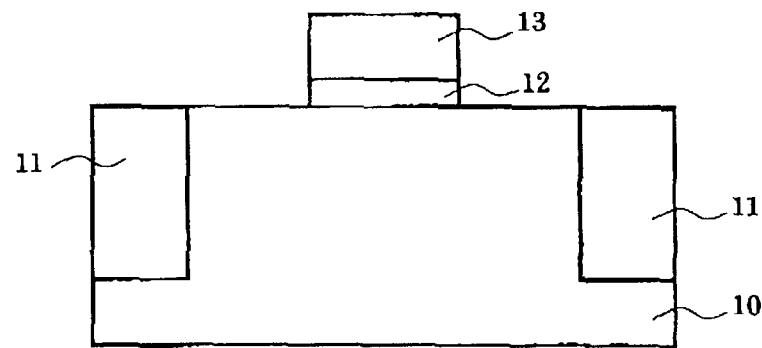

Next, as shown in FIG. 16C, a pattering process of the gate electrode 13 and the gate insulating film 12 is carried out.

Figure 16D:
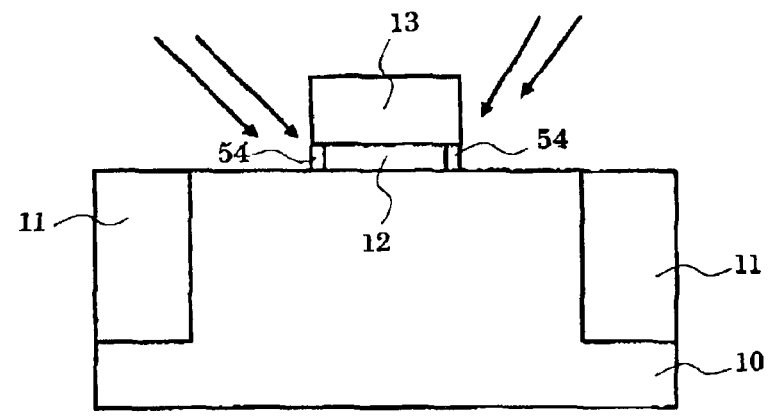

Next, as shown in FIG. 16D, the high concentration region 54 is formed near the both ends of the gate insulating film 12. As this method, "slanting ion implantation" can be used, for example. For example, the ion implantation of the aluminum is carried out with the incident angle of about 60 degrees to the main surface of the semiconductor layer 10. The acceleration voltage may be 1 kV and the dose amount may be $1\times10^{16}$ cm$^{-2}$.

By this ion implantation, the high concentration region 54 where aluminum is introduced by relatively higher concentration in the both ends of the gate insulating film 12 covering a width of about 5 nm can be formed.

Figure 17A:
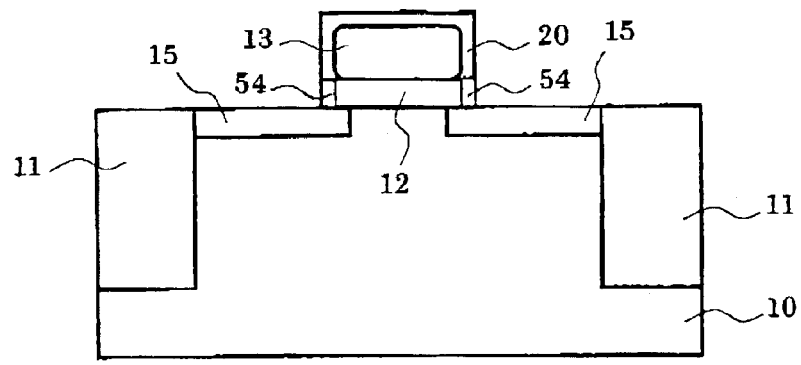

In this plasma nitriding process, the content of the aluminum in the high concentration region 54 can be made into about 10%. The following process may be essentially the same as those mentioned with reference to FIGS. 3A through 3D. That is, as shown in FIG. 17A, the process which rounds the corners of the gate electrode 13 is carried out, and the extension regions 15 are formed further. Specifically, the exposed section of the gate electrode 13 is oxidized or nitrided by a heat treatment in an oxygen atmosphere or in an nitrogen oxygen (NO) atmosphere, and thus, the roundings are formed at the corners of the gate electrode 13.

In this process, invasion of the oxygen to the inside through the inside of the gate insulating film 12 or along the interfaces of the upper and lower sides can be effectively prevented by the high concentration region 54 formed previously. That is, formation of an interface oxide layer which was mentioned above with reference to FIGS. 26B and 26C can be prevented certainly.

Figure 17B:
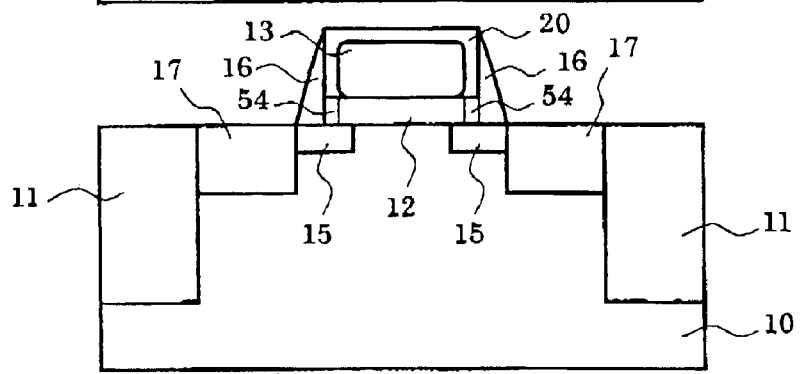
Figure 17C:
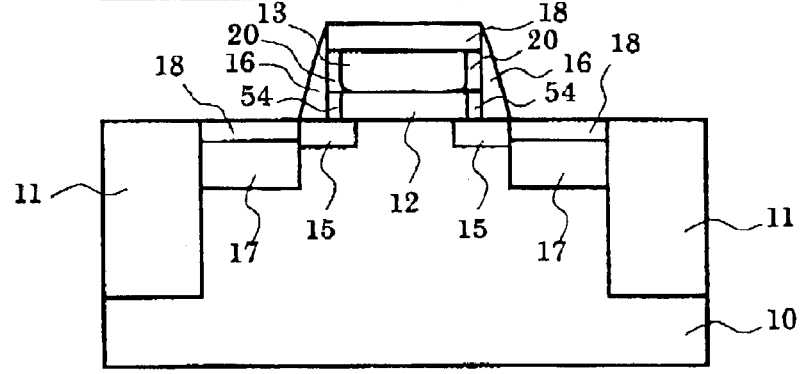
Figure 17D:
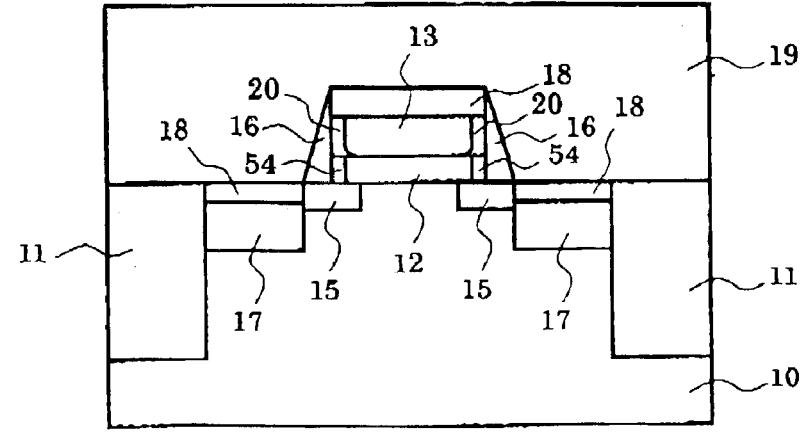

Next, as shown in FIG. 17B, side walls 16 are formed and the source/drain regions 17 of the contact section are formed further. Then, as are shown to FIG. 17C, and the contact layer 18 is formed and as shown in FIG. 17D, an insulating film 19 is deposited, and the principal part of a semiconductor device is completed by forming suitably the contact holes and wirings which are not illustrated.

As explained, according to the embodiment, by providing the high concentration region 54 which includes aluminum by a higher content, an invasion of oxygen can be firmly blocked and thus, a minute and a high-performance semiconductor device can be realized.

As mentioned above as the second embodiment, the high concentration region 24 which contains aluminum by high concentration relatively in the surface side (side near the gate electrode 13) of the gate insulating film 12 can be further provided in addition to the high concentration region 54. That is, invasion of the oxygen through the interface of the gate insulating film 12 and the gate electrode 13 can be prevented still more firmly by establishing the high concentration region 24 where the concentration of aluminum is higher in the surface side of the gate insulating film 12.

Furthermore, as explained above, not only aluminum but also nitrogen and/or silicon may be introduced into the high concentration region 24.

(Sixth Embodiment)

Figure 18:
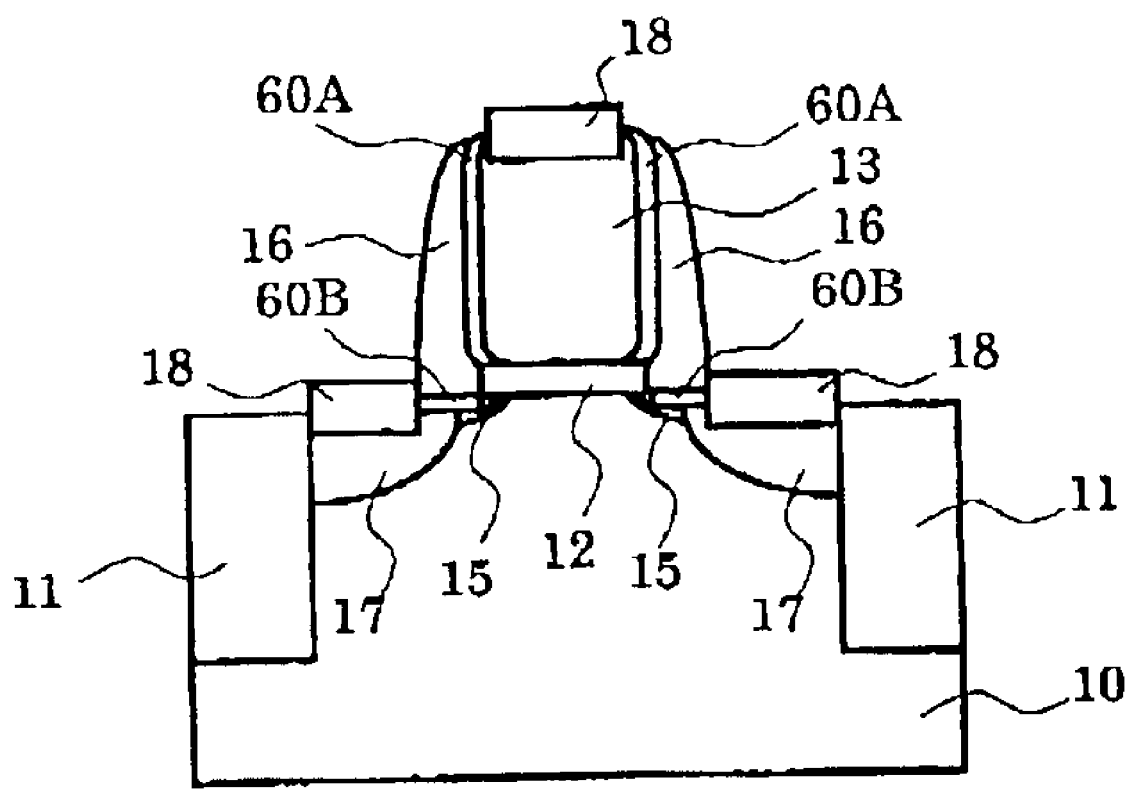
FIG. 18 is a schematic diagram which exemplifies the principal part cross-sectional structure of the semiconductor device according to the sixth embodiment.

Next, the sixth embodiment of the invention will be explained. FIG. 18 is a schematic diagram which exemplifies the principal part cross-sectional structure of the semiconductor device concerning the embodiment. The same symbols are given to the similar elements as what was mentioned above about FIGS. 1 through 17D about this figure, and detailed explanation is omitted.

Also in MISFET of this embodiment, as shown in FIG. 18, the lower corners of the gate electrode 13 are rounded.

Moreover, in the central channel part, a layer with a low dielectric constant like the interface oxide layer 105 shown in FIGS. 26B or 26C is not formed in the interface between the gate insulating film 12 and the semiconductor layer 10, nor in the interface between the gate insulating film 12 and the gate electrode 13.

An insulating film 60A is formed on the side surface of the gate electrode 13, and an insulating film 60B is similarly formed on the extension regions 15. These insulating films 60A and 60B have a low dielectric constant. The thickness of the insulating film 60A on the side of a gate electrode 13 is made almost to the same extent as the thickness of the insulating film 60B on the extension regions 15.

According to the structure of this embodiment explained above, first, by rounding the lower corners of the gate electrode 13, the electric-field concentration in the lower corners of the gate electrode 13 is eased, and thus, the insulating reliability of the gate insulating film 12 improves.

Moreover, since the interface oxide layer 105 with a low dielectric constant which was mentioned above with reference to FIGS. 26B and 26C is not formed in the central channel part at the interface between the gate insulating film 12 and the semiconductor layer 10, nor the interface between the gate insulating film 12 and the gate electrode 13, the following problems are solved:

(1) A threshold becomes very high. Especially, when gate length (Lg) becomes short, the threshold becomes very high because the thickness of the interface oxidization layer 105 increases.

(2) Current driving force decreases.

(3) Properties, such as a threshold and driving force, vary from element to element.

Furthermore, by providing the good insulating films 60A and 60B with a low dielectric constant, the distances between the nitride silicon (SiN) which constitutes the gate side wall 16 and the gate electrode 13, the extension region 15 and the channel section may separate, and thereby a parasitic capacitance decreases.

Furthermore, electric charge traps decreases, and thus the switching speed improves and reduction of the driving power is prevented. That is, according to this embodiment, without forming an interface oxide layer, the corners of the gate electrode 13 can be rounded and the still better insulating films 60A and 60B can be formed.

Furthermore, according to this embodiment, not by forming the insulating film 60A more thickly than the insulating film 60B, but by forming these films 60A and 60B so that their thickness is almost comparable, MISFET can carry out a stable operation and reliability can be also improved. Hereafter, this reason is explained.

Figure 19A:
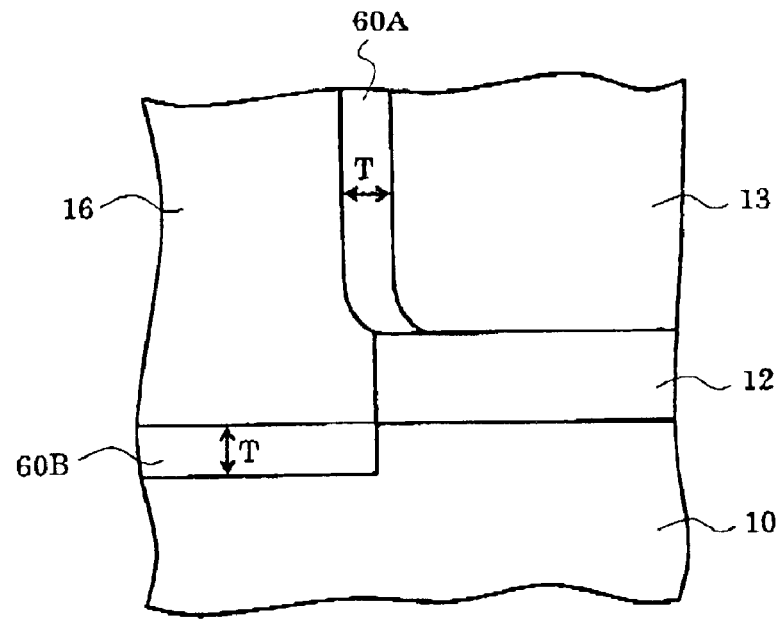
FIGS. 19A and 19B are schematic diagrams showing the principal part cross-sectional structure acquired when the balance of the thickness of insulating film 60A and insulating film 60B is changed.
Figure 19B:
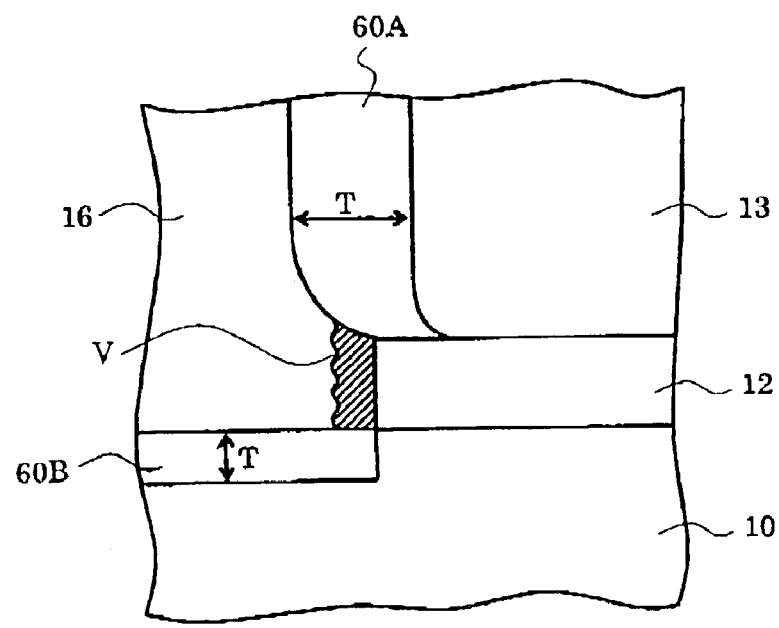

FIGS. 19A and 19B are schematic diagrams showing the principal part cross-sectional structure acquired when the balance of the thickness of insulating film 60A and insulating film 60B is changed.

That is, these figures show an enlarged view of the parts near the lower corner of the gate of MISFET. FIG. 19A shows the case where the thicknesses of the insulating film 60A and the insulating film 60B are made comparable, while FIG. 19B shows the case where the thickness of the insulating film 60A is larger than the thickness of the insulating film 60B.

The structure shown in FIG. 19B is explained first. If the thickness T1 of insulating film 60A on the side of the gate electrode 13 becomes thick as shown in FIG. 19B, the film 60A projects outside the gate insulating film 12 and forms a so-called "overhang" on the gate insulating film 12. Then, in the formation process of the gate side walls 16, when material, such as nitride silicon, is deposited by methods, such as CVD and a sputtering, it would not be fully deposited under the overhang. As a result, the void V is formed.

Such a void V may become causes of the problems, such as current leak and concentration of an electric field, and therefore, is not desirable in respect of the stability of operation and reliability of MISFET.

On the other hand, if the thickness T1 of insulating film 60A on the side of the gate electrode 13 is not thickly formed as shown in FIG. 19A, an overhang is small and can prevent generating of void V.

However, if the heat treatment is carried out in an atmosphere containing oxygen in order to form insulating films 60A and 60B, a phenomenon in which the gate electrode 13 which consists of polycrystalline silicon has an oxidization speed larger than the extension regions 15 which consists of single crystal silicon is observed.

According to the examination of the Inventors, the oxidization speed of polycrystalline silicon is 1.5 or more times larger than the oxidization speed of single crystal silicon. Therefore, if insulating film 60A having a thickness (it may be the thickness T1 exemplified in FIG. 19A) required to round the corners of the gate electrode 13 is formed, the thickness of insulating film 60B formed on the extension regions 15 will become smaller than this.

However, when the thickness of insulating film 60B on the extension regions 15 becomes small in this way, the withstand voltage against the electric field applied between the source/drain and the gate becomes insufficient, and there is a possibility that leak and insulating destruction may arise.

On the other hand, if the thickness T2 of insulating film 60B on the extension regions 15 is thickly formed in order to prevent these problems, the thickness T1 of insulating film 60A of the side of gate electrode 60 becomes too large, as exemplified in FIG. 19B, and void V may be produced under the overhang.

In order to overcome these problems, in this embodiment, insulating films 60A and 60B are formed using an active oxygen as will be explained later in greater detail. According to this process, balance of the thicknesses of insulating films 60A and 60B can be made comparable. Namely, the extension regions 15 which consist of single crystal silicon, and the gate electrode 13 which consists of a polycrystalline can be oxidized at a comparable oxidization speed by oxidize them using a radical oxygen.

As a result, the thickness T2 of insulating film 60B on the extension regions 15 can be made thick enough, while the thickness T1 of insulating film 60A on the side of the gate electrode 13 can be made at the comparable extent, and thus, the generation of the void V can be surely prevented.

Furthermore, the insulating films 60A and 60B formed by using the radical oxygen in this way are better than the oxide films formed by a conventional heat process in an oxygen atmosphere in the respects of the elaborateness, an insulating property, and interface levels, etc. As a result, the operating characteristic and reliability of a semiconductor device can be improved further.

Next, the manufacture method of the semiconductor device of this embodiment will be explained.

FIGS. 20A through 21C are process sectional views showing the principal part of the manufacture method of the semiconductor device of this embodiment. The same symbols are given to the similar elements as what was mentioned above about FIGS. 1 through 18 also about these drawings, and the detailed explanation is omitted.

Figure 20A:
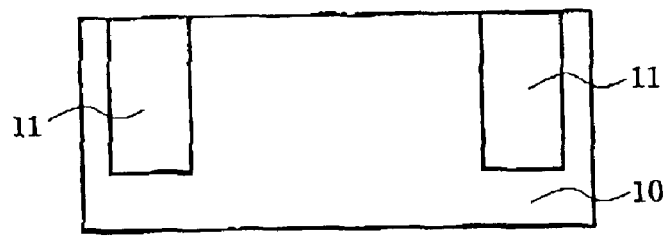
FIGS. 20A through 21C are process sectional views showing the principal part of the manufacture method of the semiconductor device of the sixth embodiment.

Also in this example, first, as shown in FIG. 20A, the isolation regions 11, such as STI, are formed in the surface of the semiconductor layer 10.

Figure 20B:
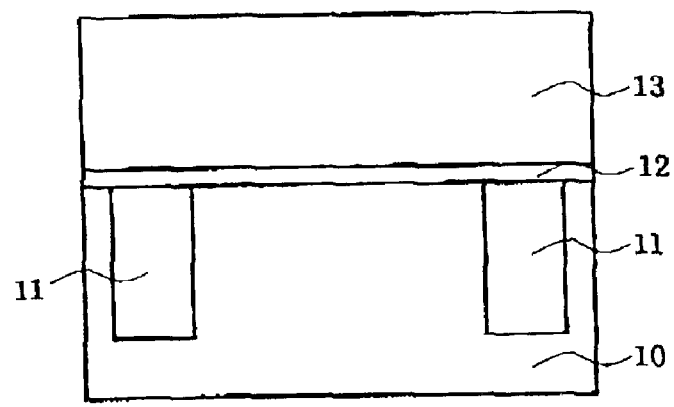

Next, as shown in FIG. 20B, the laminating structure of the gate insulating film 12 and the gate electrode 13 is formed. For example, the hafnium silicon oxide (HfSiO) film 12 used as a gate insulating film is deposited in 4 nm thickness all over a wafer at 570 degrees in centigrade by the CVD method. Then, by exposing the surface of the HfSiO film 12 for about 60 seconds to a plasma of Ar/N2 generated at about 60 Pa argon (Ar) and nitrogen (N2) atmosphere at the input power of 1.5 kW and at the substrate temperature of 400 degrees in centigrade, and thus, the nitrogen is introduced in a surface layer of the HfSiO film 12. Then, the polycrystalline silicon 13 used as a gate electrode is deposited by the CVD method.

Figure 20C:
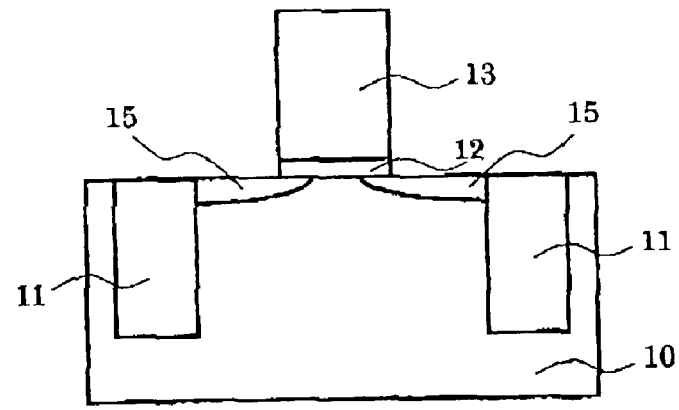

Next, as shown to FIG. 20(c), patterning of the gate is carried out. Specifically, a mask (not shown) which specifies the position of the gate electrode 13 is formed by a photolithography process, and patterning of the gate electrode 13 is carried out by etching the polycrystalline silicon 13 by reactive ion etching (RIE) using a chloride gas (for example, mixture with BCl3, or BCl3 and HBr). Then, the gate insulating film 12 is etched by a dilute hydrofluoric acid by using the gate electrode 13 as a mask. Then, arsenic (As) or boron (B) is introduced into the semiconductor layer 10 by ion implantation, and thus the extension region 15 is formed.

Figure 20D:
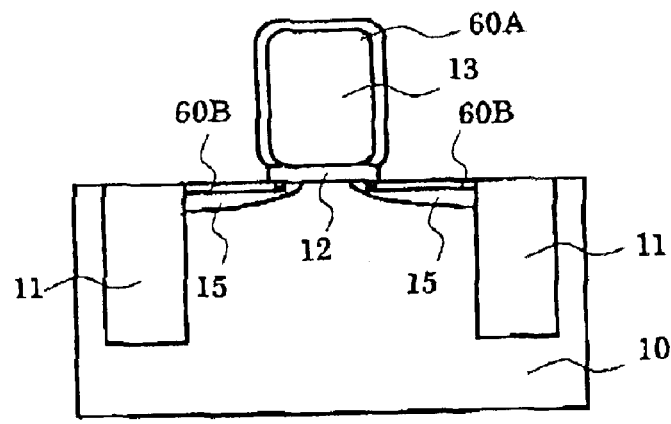

Next, as shown in FIG. 20D insulating films 60A and 60B are formed, and the corners of the gate electrode 13 are rounded. In this embodiment, active oxygen such as radical oxygen and oxygen ion are used in order to form the insulating films 60A and 60B. At least two effects can be obtained by using the active oxygen.

One of the effects is being able to make the thicknesses of the insulating films 60A and 60B comparable, as mentioned above with reference to FIGS. 19A and 19B.

Another effect is being able to reduce the invasion of oxygen through the inside or upper or lower interface of the gate insulating film 13, on the occasion of formation of insulating films 60A and 60B. For example, by exposing the wafer to a plasma for about 30 seconds in a Ar/N$_2$ atmosphere at about 60 Pa at the input power of 1.5 kW and at the substrate temperature of 400 degrees in centigrade, and thus, the damage of the corner of the gate insulating film 12 introduced by the etching process of the gate electrode 13 and the ion implantation process of the extension regions 15 can be recovered, and at the same time, the lower corners of the gate electrode 13 are rounded.

At this time, the insulating film 60A is simultaneously formed on the side wall of the gate electrode 13, and insulating film 60B is formed on the surface of the silicon semiconductor layer 10 at the extension regions 15. In this process, as explained with reference to FIG. 19A, the good insulating films 60A and 60B can be formed in the almost same thickness by using the active oxygen. Besides, when the active oxygen is used, formation of an interface oxide layer 105 which was mentioned above with reference to FIGS. 26B and 26C can also be reduced.

Figure 21A:
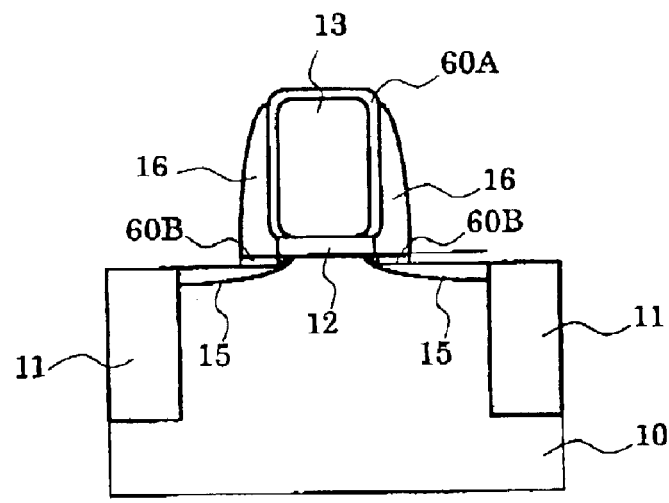

Next, as shown in FIG. 21A, side walls 16 are formed. Specifically, a silicon nitride (SiN) is first deposited on the whole wafer and the etching back process is carried out by reactive ion etching, for example, and thus, side walls 16 can be formed. At this stage, since the amount of overhang of the insulating film 60A is small in this embodiment as shown in FIG. 19A, the silicon nitride is completely filled under the film 60A and the generation of the void V can be effectively prevented.

Figure 21B:
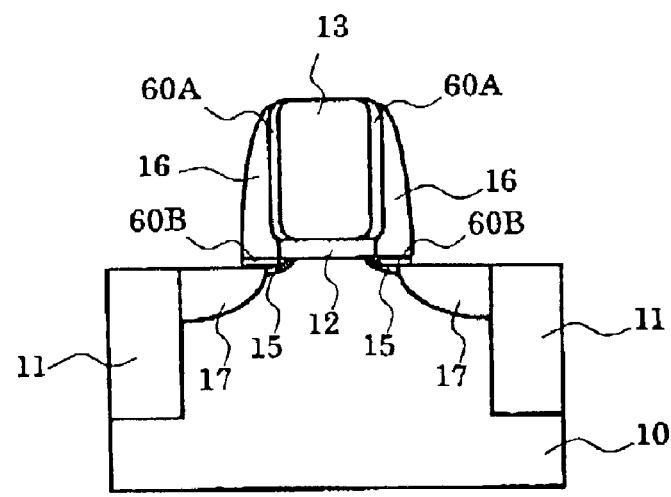

Then, as shown in FIG. 21B, the source/drain regions 17 are formed by carrying out the ion implantation of the impurities, such as arsenic (As) and boron (B), and making it activated by subsequent heat treatment.

Figure 21C:
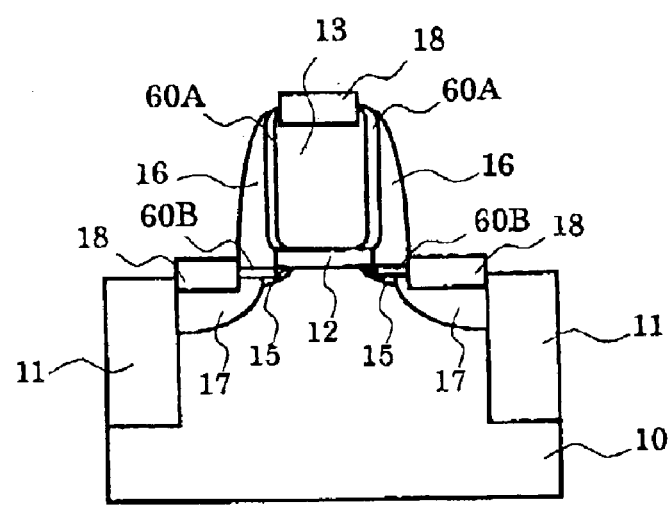

Next, as shown in FIG. 21C, the contact layer 18 made of nickel silicide, for example, is formed on the source/drain region 17 and on the gate electrode 13. Then, an insulating film (not shown) is deposited and the principal part of a semiconductor device is completed by forming suitably the contact holes and wirings which are not illustrated.

As explained above, according to the embodiment, the insulating films 60A and 60B having comparable thicknesses can be formed by using a active oxygen such as oxygen radicals or oxygen ions, and the generation of the undesirable void V as shown in FIG. 19B can be surely prevented.

Furthermore, according to the embodiment, by using an active oxygen such as oxygen radical or oxygen ion, the good insulating films 60A and 60B can be formed only near the surface, without forming an interface oxide layer.

It is thought that the reason for preventing the formation of the interface oxide layer is that a reactivity of the active oxygen with other elements is very high and the active oxygen will lose its activity before it diffuses inside from the surface of the gate insulating film 12, or the active oxygen is rather consumed for the process for recovering the damaged portion. As a result, an interface oxide layer is not formed in the inside, but the good insulating films 60A and 60B are formed only on the surface.

In order to make this effect in this embodiment more positive, it is desirable to set the temperature of the oxidization process shown in FIG. 20D about 450 degrees in centigrade or lower. Over this temperature, the oxygen which has lost the activity diffuses inside the gate insulating film 12 quickly, the therefore the interface oxide layer 105 as shown in FIG. 26B or 26C may be formed.

(Seventh Embodiment)

Next, the seventh embodiment of the invention will be explained. In the embodiment, a structure to prevent a undesirable invasion of oxygen suitable for a semiconductor device which do not have a rounded gate electrode is proposed.

Figure 22:
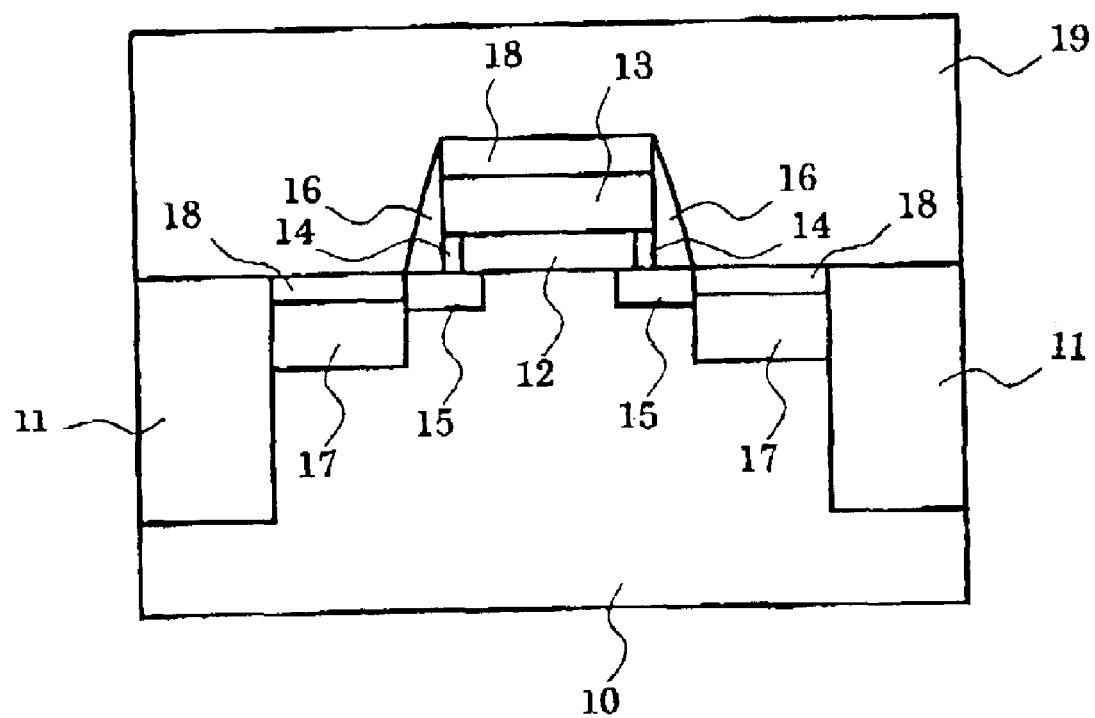
FIG. 22 is a schematic diagram which exemplifies the principal part cross-sectional structure of the semiconductor device according to the seventh embodiment of the invention.

FIG. 22 is a schematic diagram which exemplifies the principal part cross-sectional structure of the semiconductor device according to the seventh embodiment of the invention.

That is, the semiconductor device shown in this figure is an example obtained by applying the invention to MISFET structure. Isolation regions 11 are formed near the surface of the semiconductor layer 10, and the transistor is formed in the semiconductor portion separated by these regions 11.

This transistor has the gate structure where the laminating of the gate insulating film 12 and the gate electrode 13 is carried out on the semiconductor layer 10. Side walls 16 are formed in the both sides of the gate structure, and the source region 17 and the drain region 17 are formed in the outside. And the source extension region 15 and the drain extension region 15 are extending out from these source drain regions 17 towards the bottom of the gate electrode 13, respectively. Furthermore, on the gate electrode 13 and the source drain regions 17 and 17, the contact layer 18 for obtaining contact to the electrodes which are not illustrated is formed. And the structure is covered with the insulating layer 19 and wirings are provided through the contact openings which are not illustrated.

In the structure explained above, the gate insulating film 12 is formed of high dielectric material having a dielectric constant higher than a silicon oxide. As such a high dielectric material, for example, oxide of lanthanoid elements, such as a hafnium oxide (HfOx), a zirconium oxide (ZrOx), or a lantern oxide (LaOx), can be mentioned. Moreover, a yttrium oxide ($Y_2O_3$) and scandium oxide ($Sc_2O_3$) can also be mentioned. Furthermore, compounds (silicates) of these metal oxides and silicon, such as HfSiOx and ZrSiOx, can also be mentioned. Moreover, compound (or mixture) of these metal oxide and an aluminum oxide (AlOx) can also be mentioned.

On the other hand, as a material of the gate electrode 13, polycrystalline silicon can be used, for example.

And in this embodiment, the high concentration region 14 is formed near the both ends of the gate insulating film 12. The high concentration region 14 has a content of nitrogen (N) higher than the content of nitrogen near the center of the gate insulating film 12. That is, in the high concentration region 14, at least a part of the metallic elements which constitute the gate insulating film 12, or silicon is combined with nitrogen. Such nitride of silicon (Si) or metallic elements has a lower diffusion coefficient of oxygen, and thus, a diffusion of oxygen is prevented.

Furthermore, the nitrogen contained in the high concentration region 14 has the tendency to combine stably with the silicon (Si) contained in the semiconductor layer 10 and the gate electrode 13 which adjoin the upper and lower sides of the gate insulating film 12. As a result, the elaborateness in the interface between the high concentration region 14 and the lower semiconductor layer 10, and in the interface between the high concentration region 14 and the upper gate electrode 13 is improved, and thus, invasion of the oxygen along these interfaces from the both ends of the gate insulating film 12 into the inside can be prevented effectively.

That is, in a process of heating in an atmosphere containing oxygen, invasion of oxygen into the inside can be prevented by forming the high concentration region 14 at both ends of the gate insulating film 12. For example, when manufacturing the semiconductor device of this embodiments it is necessary to carry out a heat treatment in the atmosphere containing oxygen in many cases such as a deposition process of a thin film, a photolithography process, an impurities introduction process, and an annealing process, etc.

In such a case, if the high concentration region 14 is not formed, oxygen trespasses into the inside of the element through the gate insulating film 12, and there is a possibility that an interface oxide layer as shown in FIGS. 26B or 26C may be formed.

According to the embodiment, invasion of oxygen into the inside can be prevented by forming the high concentration region 14 at both ends of the gate insulating film 12. Thus, formation of the interface oxide layer 105 which was explained above with reference to FIGS. 26B and 26C can be prevented effectively. That is, by preventing formation of the interface oxidization layer 105, problems explained with reference to FIGS. 26B and 26C, such as a rise of a threshold, a fall of current driving force, or "fluctuation" of these properties can be solved, and a semiconductor device which has the higher integration, higher performance and higher reliability can be realized by using a high dielectric material.

Here, in this embodiment, since what is necessary is just to be able to prevent invasion of the oxygen from the both ends of the gate insulating film 12 in this way, the high concentration region 14 and the portion of the other gate insulating film 12 do not need to be divided clearly. That is, the high concentration region 14 may be formed by providing a continuous concentration distribution of nitride where the content of nitrogen increases relatively toward both ends in the gate insulating film 12.

In this case, there may need not be any step-like change of the content of nitrogen between the high concentration region 14 and the portion of the gate insulating film 12, and the content may change substantially continuously.

On the other hand, in the embodiment, it is also desirable that the high concentration region 14 includes not only nitrogen but silicon (Si) with a relatively higher content. The incorporated silicon (Si) bonds with nitrogen in the high concentration region 14, and invasion of oxygen can thereby be prevented more firmly.

It is also effective to introduce silicon by high concentration with nitrogen into the high concentration region 14, especially when a metal oxide which does not contain silicon is used as the material of the gate insulating film 12.

Moreover, it is also good to make the content of silicon become relatively higher in the high concentration region 14 than in the gate insulating film 12, even when a metal silicate oxide is used as the material of the gate insulating film 12.

Some of the metal nitrides are electrically conductive. Moreover, some of the nitrides have very low dielectric constants. In these cases, it is especially desirable to incorporate not only nitrogen but silicon (Si) by a high content into the high concentration region 14. The incorporated nitrogen and silicon bond each other in the high concentration region 14, and thus, a high insulation, a high dielectric constant and chemical stability can be obtained.

According to the embodiment, such high concentration region 14 is formed near the both ends of the gate insulating film 12. As a result, the portion of the gate insulating film 12 on the channel which serves as the carrier running section of a transistor (near the center of the gate insulating film 12) differs in a dielectric constant from the portion of the gate insulating film 12 on the extension regions 15 (on high concentration region 14).

By providing such a distribution of the dielectric constant, the advantages which are explained below can be obtained:

First, when the dielectric constant of the high concentration region 14 becomes relatively lower, capacitive coupling of the source/drain regions 17 and the gate electrode 13 becomes weak, and thus, the load capacity of a transistor becomes smaller. As a result, the operation speed of the transistor can be made faster.

Contrary to this, when the dielectric constant of the high concentration region 14 becomes relatively higher, it becomes possible to increase current driving power using the effect that resistance of the extension regions 15 of the source/drain become lower with the voltage of the gate. Moreover, the hot carrier reliability of a transistor can be improved according to the effect which lowers the electric field at the extension regions 15.

By incorporating a higher content of nitrogen, the relative dielectric constant of the high concentration region 14 may become either higher or lower. Such a change of the dielectric constant can be controlled by choosing suitably the element which constitutes the gate insulating film 12. Therefore, it is possible to use properly according to the role of the transistor needed in object semiconductor equipment.

On the other hand, in recent years, when using a material having a smaller band gap, such as the material containing a metal oxide, for a gate insulating film 12, the increase in power consumption due to the phenomenon that the hot carrier in a drain corner overcomes a barrier and flows into the gate, is posing a problem.

According to the embodiment, it becomes possible to arrange a material having a larger band gap as the high concentration region 14 only at the drain end, and thus, it becomes possible to prevent the increase in such power consumption.

Furthermore, in recent years, when a material with a smaller band gap and smaller breakdown voltage, such as a material including a metal oxide, is provided at the gate corner where an electric field is especially strong, a destruction of the insulating film is being a problem.

According to the invention, it is possible to provide a material having a larger band gap as the high concentration region 14 only at the drain end, and thus, it becomes possible to solve such a problem of electrical breakdown.

On the other hand, if nitrogen bonds with oxygen or is taken in a network of Si—O (silicon-oxygen), it will form a positive electric charge and a negative electric charge. Formation of such an electric charge changes a threshold of the transistor, or promotes dispersion of a carrier which runs near the gate insulation film, and may reduce a driving power of the transistor.

According to the embodiment, since high-concentration nitrogen is introduced into the gate insulation film only at the part above the extension region, there is no fear of causing such a problem. On the other hand, if nitrogen bonds with oxygen or is taken in in a network of Si—O, it may generate a trap center of for electric charge. If a majority of such traps exist, change of a threshold by a carrier being trapped may arise, or degradation of an insulating property as the whole gate insulation film may be caused.

According to the embodiment, since high-concentration nitrogen is introduced only into the part above the extension region, it is also advantageous that such a degradation of the insulation film can be prevented.

Next, the manufacture method of the semiconductor device of the embodiment will be explained.

FIGS. 23A through FIG. 24D are process sectional views showing the principal part of the manufacture method of the semiconductor device of this embodiment.

Figure 23A:
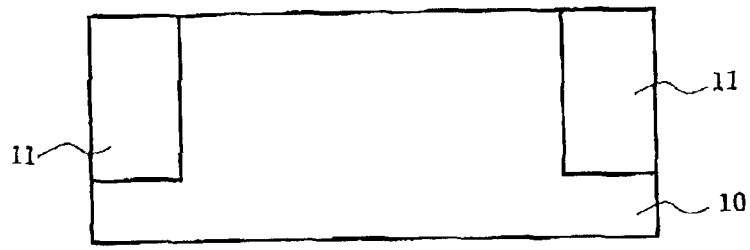
FIGS. 23A through FIG. 24D are process sectional views showing the principal part of the manufacture method of the semiconductor device of the seventh embodiment.
Figure 23B:
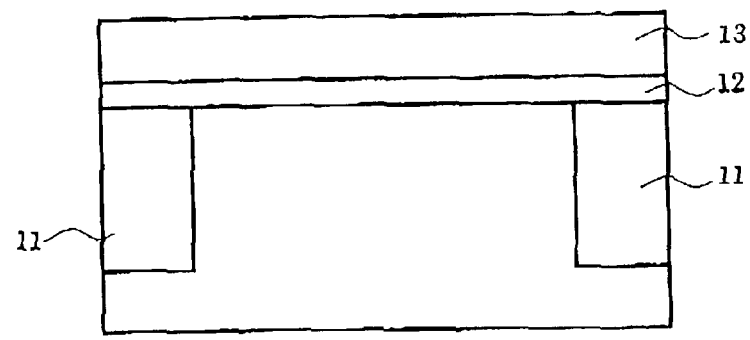

First, as shown in FIG. 23A, an isolation region 11 is formed in the surface of the silicon layer 10. Specifically, after trenching the surface of the silicon wafer for STI (Shallow Trench Isolation) at a depth of about 0.4 micrometers, an isolation region 11 is completed by depositing $SiO_2$ on the whole surface by the CVD method, and planarizing the whole surface by CMP (Chemical Mechanical Polishing), for example, Next, as shown in FIG. 23B, the gate laminating structure is formed. Specifically, the film 12 of a mixture of a hafnium (Hf) oxide and a silicon oxide which becomes a gate insulating film, is deposited in about 5 nm thickness all over a wafer at 500 degrees in centigrade by the CVD method, for example.

Next, the polycrystalline silicon 13 used as a gate electrode is deposited by the CVD method.

Figure 23C:
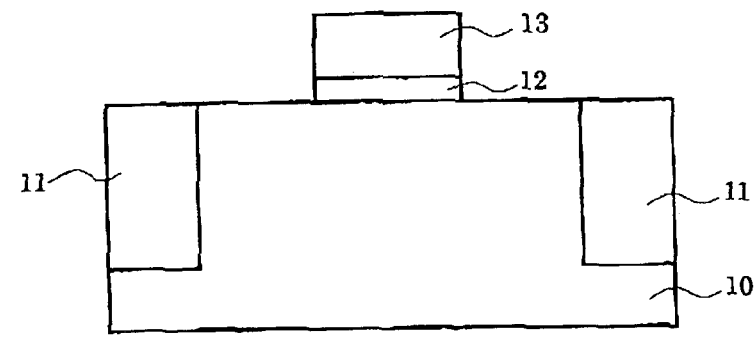

Next, as shown in FIG. 23C, a pattering process of the gate is carried out. Specifically, a mask (not shown) which specifies the position of the gate electrode 13 is formed by a photolithography process, and patterning of the gate electrode 13 is carried out by etching the polycrystalline silicon 13 by reactive ion etching (RIE) using a chloride gas (for example, mixture with BCl3, or BCl3 and HBr). Then, the gate insulating film 12 is etched by a dilute hydrofluoric acid by using the gate electrode 13 as a mask.

Figure 23D:
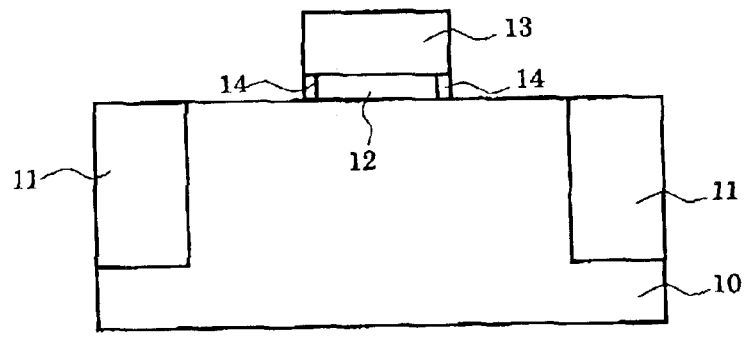

Next, as shown in FIG. 23D, the high concentration region 14 is formed near the both ends of the gate insulating film 12. Specifically, a nitrogen (N2) gas of about 10 Pa (Pascal) is introduced in a process chamber (not shown) at room temperature, and plasma nitriding process for about 60 seconds is performed with an input power of 1 kW, for example. By this nitriding processing, nitrogen can be introduced into the portion whose width is about 5 nm in the both ends of the gate insulating film 12, and the high concentration region 14 can be formed.

Figure 24A:
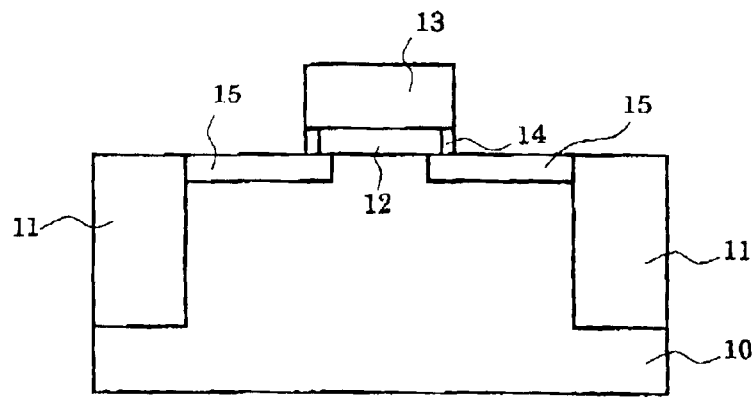

In this plasma nitriding processing, the content of the nitrogen in the high concentration region 14 can be made into about 10%. Next, as shown in FIG. 24A, by introducing impurities, such as arsenic (As) and boron (B), by ion implantation, the extension regions 15 are formed. Specifically, a heat treatment in a nitrogen atmosphere is carried out to make the implanted impurities active, for example.

In this process, by stably combining the nitrogen of the high concentration region 14 with the silicon (Si) contained in the semiconductor layer 10 and the gate electrode 13 of the upper and lower sides, the elaborateness of interfaces becomes higher and the invasion to the inside of the oxygen through these interfaces from the both ends of the gate insulating film 12 can be prevented effectively.

As a result, formation of an interface oxide layer which was mentioned above with reference to FIGS. 26B and 26C can be prevented certainly.

Figure 24B:
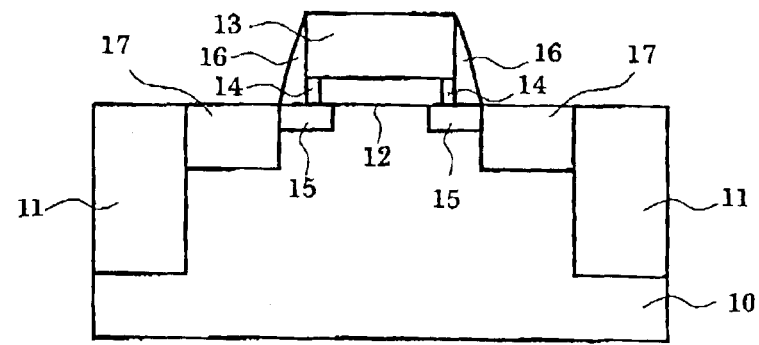

Next, as shown in FIG. 24B, side walls 16 are formed, and the source/drain regions 17 of the contact section are formed. Specifically, a silicon nitride (SiN) is first deposited on the whole wafer and the etching back process is carried out by reactive ion etching, for example, and thus, side walls 16 can be formed. Also in this stage, invasion of the oxygen remaining in the CVD gas oxygen through from the both ends of the gate insulating film 12 can be effectively prevented. As a result, formation of an interface oxide layer which was mentioned above with reference to FIGS. 26B and 26C can be prevented certainly.

Then, the source/drain regions 17 are formed by carrying out the ion implantation of the impurities, such as arsenic (As) and boron (B), and making it activated by subsequent heat treatment.

Figure 24C:
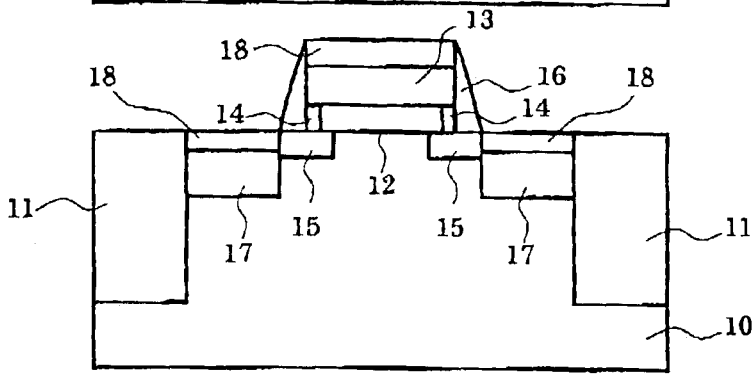
Figure 24D:
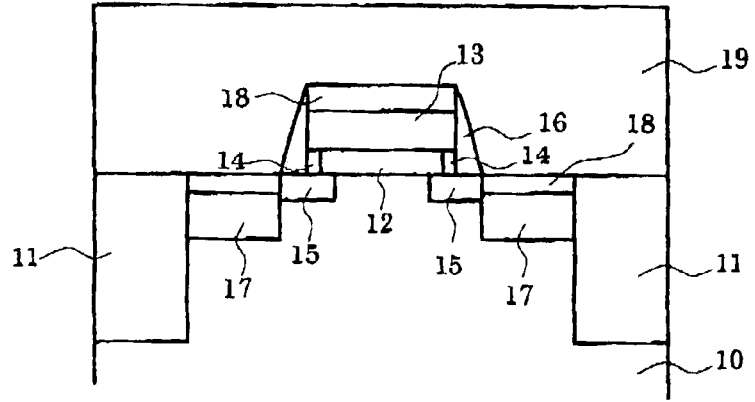
Figure 25A:
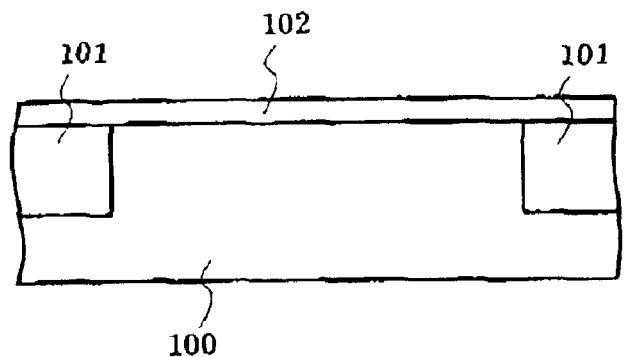
FIGS. 25A through 26C are process sectional diagrams showing principal parts of manufacturing process of MISFET (MIS Field Effect Transistor) according to a usual process flow.
Figure 25B:
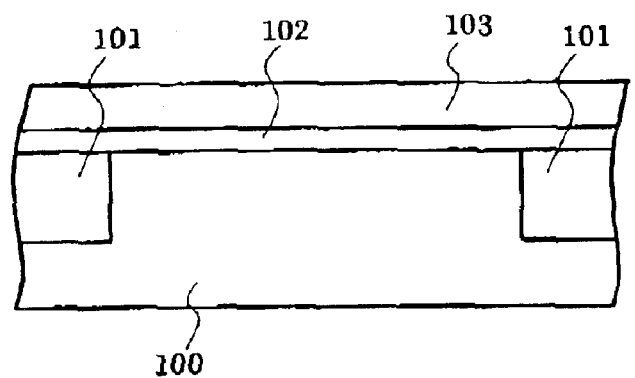
Figure 25C:
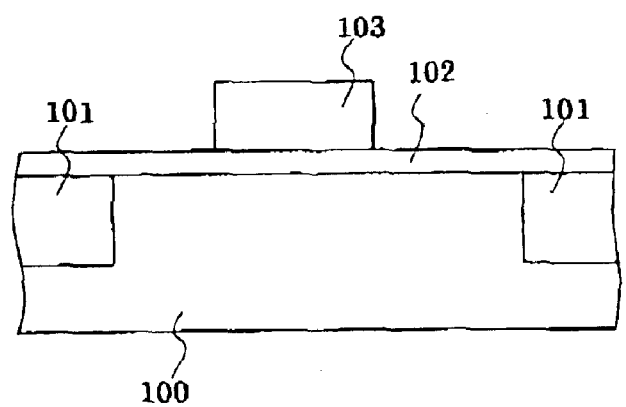

Next, as shown in FIG. 24C, the contact layer 18 is formed. Specifically, a nickel (nickel) is deposited on the whole wafer, and then, the contact layer 18 which consists of nickel silicide (NiSi) can be formed by making the nickel react with the silicon of the lower side. Then, as shown in FIG. 24D, an insulating film 19 is deposited and the principal part of a semiconductor device is completed by forming suitably the contact holes and wirings which are not illustrated. in the case of this example, the parts of the HfSiO gate insulating film right above the extension region 15 are nitrided, and the high concentration region 14 made of HfSiON is formed. The nitrogen contained in the high concentration region 14 is desirably bonded with silicon. The width of the transverse direction of the high concentration region 14 is about 5 nm, and the concentration of nitrogen thereof is raised to about 10%.

By forming such high concentration region 14, the abnormal oxidization along the upper and lower interfaces of the gate insulating film 12 is prevented in the subsequent process, and the interface oxide layer 105 which was shown in FIGS. 26B and 26C is not substantially formed. As a result, the structure where the gate insulating film 12 joined to the channel section of the semiconductor layer 10 directly is obtained. That is, according to the embodiment, the high concentration region 14 can be formed certainly and easily by introducing nitrogen from the both ends of the gate insulating film 12.

By using the semiconductor device which was formed in this way preventing the formation of interface oxide layers, a high integration can be realized while maintaining high performance and high reliability, as mentioned above with reference to FIG. 1.

In the embodiment, various kinds of conductive material, such as silicon germanium (SiGe), germanium (germanium), and nitride titanium (TiN), silicides of these materials, and germanium of there materials can be used instead of polycrystalline silicon as the material of the gate electrode 13. Moreover, as a material of the gate insulating film 12, various kinds of metal oxides or these silicates can be used similarly, as mentioned above concerning FIG. 1.

In order to introduce not only nitrogen but also silicon into the high concentration region 14, slanting ion implantation or side wall ion implantation technique can be employed, for example, as mentioned above with reference to FIG. 1.

In order to form the gate insulating film 12 as mentioned with reference to FIG. 23A, the MOCVD (Metal-Organic Chemical Vapor Deposition) method, the halide CVD method, the ALD method, the sputtering method, the vacuum depositing method, the ablation method, the wet applying method, or various kinds of other methods can be used as well.

Furthermore, during the formation process, radical or plasma can be applied, or catalyst reaction or irradiation of light can be used as well. In the plasma nitriding process mentioned above about FIG. 23D, plasma may be formed directly within the processing chamber which accommodates the wafer, or the plasma can be generated in the plasma generation chamber provided apart from the processing chamber and it may be introduced into the processing chamber.

In the case of the method of forming plasma directly in the processing chamber, the efficiency to nitride the side surfaces of the gate insulating film 12 may not be high, because the particles coming out from the plasma may incident to the substrate vertically. In such a case, as exemplified in FIG. 4, it is effective to apply a magnetic field M in a direction parallel to the substrate S, and thereby to deflect the direction of incidence of particles aslant.

On the other hand, when providing a plasma generation chamber apart from the processing chamber, as shown in FIG. 5, efficient at nitridation can be attained by installing substrate S horizontally to the direction of incidence of the radical particles.

Furthermore, also in the methods shown in FIGS. 4 and 5, nitrogen can be uniformly introduced by rotating the substrate S. Moreover, on the occasion of nitriding process which is exemplified in FIGS. 4 and 5, by forming neutralization equipments, such as an electron gun (not shown), a neutral particle can be increased and the dielectric breakdown caused by the charge up can be prevented.

Moreover, after the nitrogen introduction process mentioned above with reference to FIG. 24D, a heat treatment can be carried. This heat treatment can be substituted by the annealing process performed after the ion implantation for the extension region 15 in order to activate the implanted impurities or the annealing process performed after formation process of the side walls 16.

As a method to introduce impurity into the extension region 15, a layer such as silicon (Si) layer including the impurities can be deposited, and the extension region 15 is formed by a solid-phase diffusion from the silicon layer, for example.

Alternatively, it is also possible to dope impurities to $SiO_2$, SiON, etc. which constitute the gate side walls 16, and to form the extension region 15 by a solid-phase diffusion from these side walls 16 to the silicon surface.

On the other hand, the order of the nitrogen introduction process shown in FIG. 23D and the impurities introduction process of an extension region shown in FIG. 24A can be reverse.

Furthermore, as a material of the contact layer 18 mentioned above with reference tot FIG. 24C, it is possible to use various kinds of material including, for example, a cobalt silicide ($CoSi_2$) or a titanium silicide ($TiSi_2$) instead of the nickel silicide.

Although the preferred embodiment of the present invention has been described, referring to its examples, it is not intended that the invention should be limited to those examples.

Configuration, size, material composition, conductivity type, impurity of each component of the semiconductor device other than the aforementioned characteristics may be appropriately modified by any person skilled in the art, and it will be appreciated that such modifications should all be included in the scope of the present invention.

For example, the present invention should not be limited to a precise form of the above-mentioned MISFET using a silicon substrate, but any device using a silicon germanium (SiGe) substrate, SOI (silicon on sapphire) substrate, silicon substrate having a cavity in it or any substrate having a combination of these substrate is also included in the scope of the present invention as long as it includes the feature of the present invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
   a semiconductor layer having a source region and a drain region;
   a gate insulating film provided on the semiconductor layer between the source region and the drain region, the gate insulating film having a first end region near the source region and a second end region near the drain region and a center region between the first and second end regions, the gate insulating film comprising an oxide including a metal element, and the gate insulating film further including nitrogen as a first element, a content of the first element being relatively higher at the first and second end regions than at the center region of the gate insulating film; and
   a gate electrode provided on the gate insulating film.

2. A semiconductor device according to claim 1, wherein the gate insulating film includes at least one element selected from the group consisting of nitrogen and aluminum as a second element, a content of the second element being relatively higher at a part of the gate insulating film closer to the gate electrode than at a part of the gate insulating film closer to the semiconductor layer taken along a thickness direction of the gate insulating film.

3. A semiconductor device according to claim 1, wherein the gate insulating film further includes a silicon, and at least apart of the nitrogen have a bonding with the silicon.

4. A semiconductor device according to claim 1, wherein the gate electrode has a side surface, a bottom surface adjoining the gate insulating film, and a rounded corner provided between the side surface and the bottom surface , and the side surface and the rounded corner are covered by an oxide layer.

5. A semiconductor device according to claim 1, wherein the metal element is an element selected from the group consisting of scandium, yttrium, zirconium, hafnium and lanthanoid elements.

6. A semiconductor device comprising:
   a semiconductor layer having a source region and a drain region;
   a gate insulating film provided on the semiconductor layer, the gate insulating film being made of an oxide including a metal element, and the gate insulating film further including nitrogen as a first element in a part adjoining an interface with the semiconductor layer, a content of the first element being relatively higher at both ends of the gate insulating film than at a center of the gate insulating film taken along a direction passing through the source region and the drain region; and
   a gate electrode provided on the gate insulating film.

7. A semiconductor device according to claim 6, wherein the gate insulating film includes at least one element selected from the group consisting of nitrogen and aluminum as a second element, a content of the second element being relatively higher at a part of the gate insulating film closer to the gate electrode than at a part of the gate insulating film closer to the semiconductor layer taken along a thickness direction of the gate insulating film.

8. A semiconductor device according to claim 6, wherein the gate insulating film further includes a silicon, and at least a part of the nitrogen have a bonding with the silicon.

9. A semiconductor device according to claim 6, wherein the gate electrode has a side surface, and a rounded corner provided between the side surface and a bottom surface adjoining the gate insulating film, and the side surface and the rounded corner are covered by an oxide layer.

10. A semiconductor device according to claim 6, wherein the metal element is an element selected from the group consisting of scandium, yttrium, zirconium, hafnium and lanthanoid elements.

11. A semiconductor device comprising:
    a semiconductor layer having a source region and a drain region;
    a gate insulating film provided on the semiconductor layer between the source region and the drain region, the gate insulating film being made of an oxide including a metal element;
    high concentration regions, each of the high concentration regions adjoining the gate insulating film at its end near the source region and at its end near the drain region respectively, the high concentration regions including nitrogen as a first element, and a content of the first element being relatively higher at the high concentration regions than at the gate insulating film; and
    a gate electrode provided on the gate insulating film and the high concentration regions.

12. A semiconductor device according to claim 11, wherein a content of the nitrogen is relatively higher at a part of the gate insulating film closer to the gate electrode than at a part of the gate insulating film closer to the semiconductor layer taken along a thickness direction of the gate insulating film.

13. A semiconductor device according to claim 11, wherein the high concentration region further includes a silicon, and at least a part of the nitrogen have a bonding with the silicon.

14. A semiconductor device according to claim 11, wherein the gate electrode has a side surface, and a rounded corner provided between the side surface and a bottom surface adjoining the gate insulating film, and the side surface and the rounded corner are covered by an oxide layer.

15. A semiconductor device according to claim 11, wherein the metal element is an element selected from the group consisting of scandium, yttrium, zirconium, hafnium and lanthanoid elements.

16. A semiconductor device according to claim 1, wherein at least a part of the metal element is combined with the first element in the first and second end regions.

17. A semiconductor device according to claim 6, wherein at least a part of the metal element is combined with the first element at the both ends of the gate insulating film.

18. A semiconductor device according to claim 11, wherein at least a part of the metal element is combined with the first element at the high concentration regions at the gate insulating film.

19. A semiconductor device comprising:
    a semiconductor layer having a source region and a drain region;

a gate insulating film provided on the semiconductor layer between the source region and the drain region, the gate insulating film having a first end region near the source region and a second end region near the drain region and a center region between the first and second end regions, the gate insulating film comprising an oxide including a metal element, and the gate insulating film further including aluminum as a first element, a content of the first element being relatively higher at the first and second end regions than at the center region of the gate insulating film; and a gate electrode provided on the gate insulating film.

20. A semiconductor device according to claim 19, wherein the gate electrode has a side surface, a bottom surface adjoining the gate insulating film, and a rounded corner provided between the side surface and the bottom surface, and the side surface and the rounded corner are covered by an oxide layer.

21. A semiconductor device according to claim 19, wherein the metal element is an element selected from the group consisting of scandium, yttrium, zirconium, hafnium and lanthanoid elements.

22. A semiconductor device comprising:

a semiconductor layer having a source region and a drain region;

a gate insulating film provided on the semiconductor layer, the gate insulating film being made of an oxide including a metal element, and the gate insulating film further including aluminum as a first element in a part adjoining an interface with the semiconductor layer, a content of the first element being relatively higher at both ends of the gate insulating film than at a center of the gate insulating film taken along a direction passing through the source region and the drain region; and a gate electrode provided on the gate insulating film.

23. A semiconductor device according to claim 22, wherein the gate electrode has a side surface, and a rounded corner provided between the side surface and a bottom surface adjoining the gate insulating film, and the side surface and the rounded corner are covered by an oxide layer.

24. A semiconductor device according to claim 22, wherein the metal element is an element selected from the group consisting of scandium, yttrium, zirconium, hafnium and lanthanoid elements.

25. A semiconductor device comprising:

a semiconductor layer having a source region and a drain region;

a gate insulating film provided on the semiconductor layer between the source region and the drain region, the gate insulating film being made of an oxide including a metal element;

high concentration regions, each of the high concentration regions adjoining the gate insulating film at its end near the source region and at its end near the drain region respectively, the high concentration regions including aluminum as a first element, and a content of the first element being relatively higher at the high concentration regions than at the gate insulating film; and a gate electrode provided on the gate insulating film and the high concentration regions.

26. A semiconductor device according to claim 25, wherein a content of the aluminum is relatively higher at a part of the gate insulating film closer to the gate electrode than at a part of the gate insulating film closer to the semiconductor layer taken along a thickness direction of the gate insulating film.

27. A semiconductor device according to claim 25, wherein the gate electrode has a side surface, and a rounded corner provided between the side surface and a bottom surface adjoining the gate insulating film, and the side surface and the rounded corner are covered by an oxide layer.

28. A semiconductor device according to claim 25, wherein the metal element is an element selected from the group consisting of scandium, yttrium, zirconium, hafnium and lanthanoid elements.

* * * * *